United States Patent
Najda

(10) Patent No.: US 6,829,272 B1
(45) Date of Patent: Dec. 7, 2004

(54) SEMICONDUCTOR LASER DEVICE

(75) Inventor: Stephen Peter Najda, Oxford (GB)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 09/501,947

(22) Filed: Feb. 10, 2000

(30) Foreign Application Priority Data

Feb. 13, 1999 (GB) .............................................. 9903188

(51) Int. Cl.[7] .............................. H01S 5/00
(52) U.S. Cl. .......................... 372/45; 372/43; 372/44; 372/46; 372/47; 372/48; 372/49; 372/50
(58) Field of Search ...................... 372/43–50

(56) References Cited

U.S. PATENT DOCUMENTS

| | | | | |
|---|---|---|---|---|
| 4,434,491 A | * | 2/1984 | Sakuma et al. | 372/45 |
| 4,811,354 A | * | 3/1989 | Uomi et al. | 372/45 |
| 4,885,753 A | * | 12/1989 | Okai et al. | 372/45 |
| 4,916,708 A | * | 4/1990 | Hayakawa | 257/191 |
| 5,497,389 A | * | 3/1996 | Kasukawa et al. | 372/34 |
| 5,509,024 A | | 4/1996 | Bour et al. | 372/45 |
| 5,619,518 A | * | 4/1997 | Horie et al. | 372/45 |
| 5,753,933 A | | 5/1998 | Morimoto | 257/14 |
| 5,920,767 A | * | 7/1999 | Horie et al. | 438/40 |
| 6,252,894 B1 | * | 6/2001 | Sasanuma et al. | 372/44 |
| 6,278,136 B1 | * | 8/2001 | Nitta | 257/103 |

FOREIGN PATENT DOCUMENTS

| | | |
|---|---|---|
| EP | 0539162 | 4/1993 |
| EP | 0540799 | 5/1993 |
| EP | 0578836 | 1/1994 |
| EP | 0660472 | 6/1995 |
| EP | 0701309 | 3/1996 |
| EP | 0794601 | 9/1997 |
| WO | 9740560 | 10/1997 |

OTHER PUBLICATIONS

Search Report, Application No. GB 9903188.2, dated Apr. 28, 1999.

\* cited by examiner

*Primary Examiner*—Don Wong
*Assistant Examiner*—Delma R. Flores-Ruiz
(74) *Attorney, Agent, or Firm*—Renner, Otto, Boisselle & Sklar, LLP

(57) ABSTRACT

An SCH laser device fabricated in the (Al,Ga,In)P system has an active region disposed within an optical guiding region. The optical guiding region is disposed between an n-doped cladding region and a p-doped cladding region. The laser device is provided with optical confinement layers, which are disposed at the interfaces between the optical guiding region and the cladding regions. The optical confinement regions produce increased confinement of the optical field, and reduce the penetration of the optical field into the cladding regions. The optical confinement region on the p-side of the device also serves as a potential barrier to the transport of electrons into the p-doped cladding region. The cladding regions have a low Al mole fraction, so that they have a direct bandgap. This prevents carrier loss by trapping in the DX level in the cladding regions. In an alternative embodiment, the cladding regions have a graded composition, with their composition at the interface with the optical confinement layers being such that the DX level in the cladding regions is degenerate with the X-conduction band in the optical confinement layers.

30 Claims, 17 Drawing Sheets

A diagram of the variation of the $Ga_{0.25}In_{0.48}P/(AlGa)InP$ heterobarrier height (meV) as a function of aluminium mole fraction in the quaternary alloy assuming a 70:30 band offset ratio

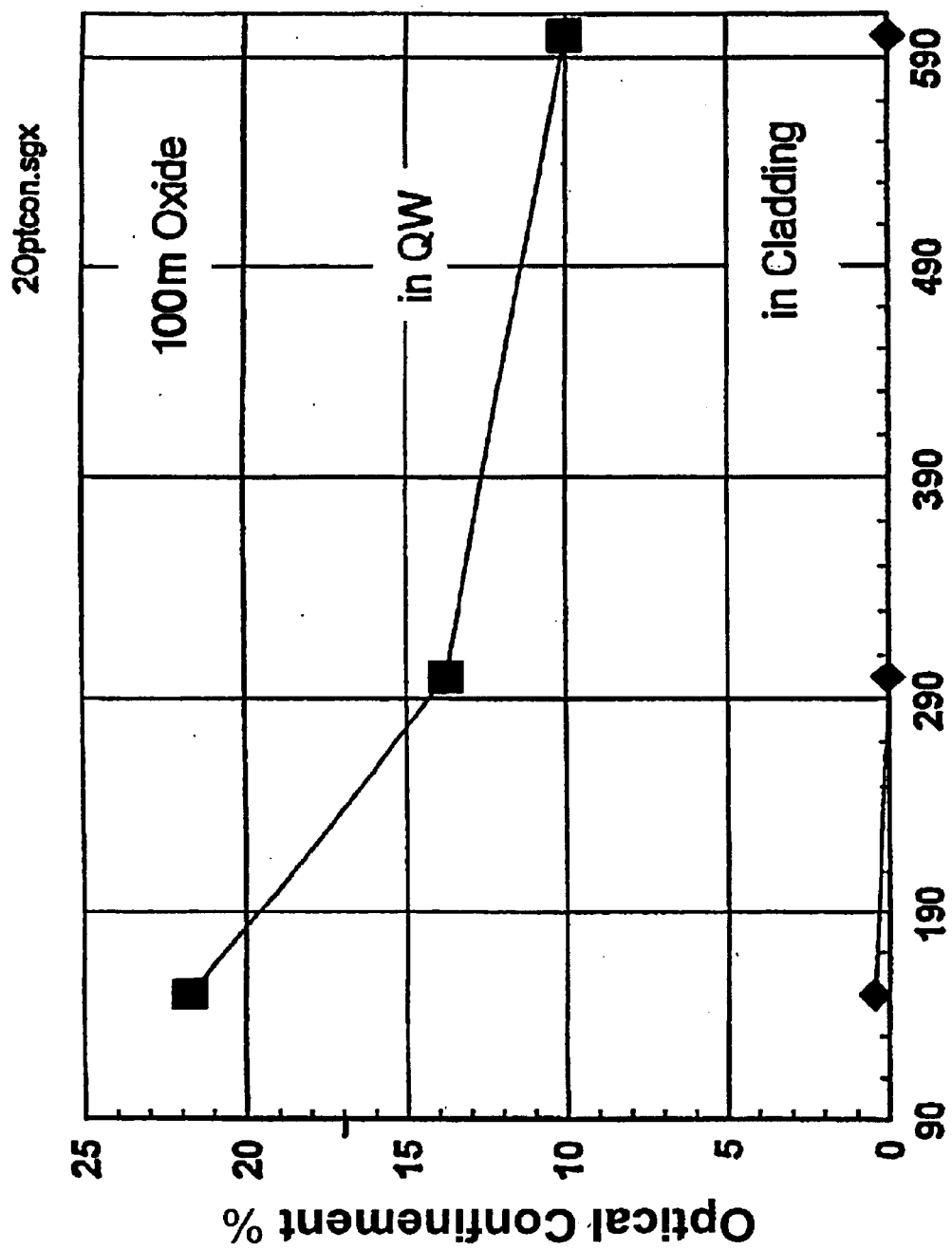

SEMICONDUCTOR LASER DEVICE

BACKGROUND OF THE INVENTION

Field of the invention

This invention relates to a semiconductor laser device and particularly, but not exclusively, to a semiconductor laser device that emits visible radiation in the wavelength range 630 nm to 680 nm. The laser device may be of the edge-emitting or of the surface-emitting type.

Laser devices or laser diodes (LDs) fabricated in the (Al,Ga,In)P material system which emit visible light in the 630 nm–680 nm wavelength range are becoming increasingly important components of professional and consumer products. For example, it is envisaged that the Digital Video Disc (DVD) system will employ a 635 nm–650 nm wavelength LD capable of delivering up to 30 mW output power up to a temperature of 60° C. The next generation of semiconductor lasers will need an even greater maximum power output up to a higher (eg. 70° C.) operating temperature.

By the (Al,Ga,In)P system is meant the family of compounds having the general formula $(Al_yGa_{1-y})_{1-x}In_xP$, where both x and y are between 0 and 1. One particular advantage of this semiconductor system is that it in lattice-matched to a GaAs substrate when the indium mole fraction, x, is equal to 0.48.

For convenience, the compound $(Al_yGa_{1-y})_{1-x}In_xP$ with x, y≠0 and x, y≠1 will generally be referred to an AlGaInP in the specification and claims. Similarly, the compound with y=1 will generally be referred to as AlInP, and the compound with y≠0 will generally be referred to as GaInP.

2. Description of the Related Art

A principal limitation of current (Al,Ga,In)P laser diodes is that they are incapable of operating for long periods (or with a sufficiently low threshold current) at the highest specified operating temperature. It is generally believed that this is caused by electron leakage from the active region of the device into the surrounding optical guiding region and subsequently into the p-type cladding region.

The generic structure of a separate confinement laser structure intended to generate light at 630–680 nm will now be described with reference to FIGS. 1 and 2.

Curve (a) of FIG. 1 illustrates the difference between the Γ-conduction band energy of $(Al_yGa_{1-y})_{0.52}In_{0.48}P$, and $Ga_{0.52}In_{0.48}P$, as a function of the aluminum hole fraction in the quaternary alloy. Curves (b) and (a) of FIG. 1 show the difference between the X-conduction band energy and the Γ-valance band energy respectively. FIG. 1 assumes that the bandgap difference between AlGaInP and GaInP is split in a ratio of 70:30 between the conduction band offset and the valance band off set—see S. P. Najda et al, "Journal of Applied Physics", Vol 77, No. 7, page 3412, 1995.

It will be soon that the minimum energy in the conduction band of (Al,Ga,In)P is a function of the aluminum content. There is a crossover from a Γ-band minimum to an X-band minimum at an aluminum concentration of about 0.55.

The terms Γ-band and X-band as used herein refer to symmetry points in the Brillouin zone and are standard terms in solid state physics, see for example R. A. Smith "Semiconductors", (Cambridge University Press, 1978). The terms Γ-minimum and X-minimum refer to the minimum energy level of the Γ-band and the X-band, respectively.

FIG. 2 is a schematic band structure of a separate confinement laser structure fabricated in the (Al,Ga,In)P system.

It consists of an n-doped $(Al_{0.7}Ga_{0.3})_{0.52}In_{0.48}P$ cladding region 1, an $(Al_{0.5}Ga_{0.5})_{0.52}In_{0.48}P$ optical guiding region 2, 4, a GaInP quantum well active region 3 disposed within the $(Al_{0.5}Ga_{0.5})_{0.52}In_{0.48}P$ optical guiding region, and a p-doped $(Al_{0.7}Ga_{0.3})_{0.52}In_{0.48}P$ cladding region. Optical transitions giving rise to laser action in the quantum well active region 3 of the laser diode originate from Γ-electrons in the GaInP quantum well active region.

The electron leakage current consists of that fraction of the electrons which have sufficient thermal energy to surmount the potential barrier on the right hand side of FIG. 2, and pass into the p-doped cladding region 5. It will be seen that Γ-electrons are confined in the optical guiding region (waveguide region) by a potential barrier of only around 90 meV at the interface with the p-doped cladding region. This relatively small barrier height allows a significant proportion of electrons to escape. Moreover, holes in the valence band are confined only by a potential barrier of around 50 meV, and this low barrier height also allows significant carrier escape. Furthermore the X-conduction band in the p-cladding region 5 is some 50 meV below the Γ-conduction band in the waveguiding region 2, 4, and this allows electrons to escape from the waveguiding region 2, 4 through the X-states in the p-doped cladding regions. Thus, the laser illustrated in FIG. 2 has a high leakage current, and so has poor performance at high temperatures.

In the laser structure shown in FIG. 2, the free carrier population of the n-doped cladding region 1 tends to saturate. This saturation of the free carrier concentration arises owing to the Fermi energy being pinned at the free energy level of the DX level in the n-doped cladding region 1. As is shown in FIG. 2, the DX level is lower than the X-band conduction minimum in the n-doped cladding region 1 (by around 100 meV). Saturation of the carrier concentration owing to Fermi pinning at the DX level in AlGaAs has been reported by A. Y. Du et al in "Applied Physics Letters" Vol 66 No. 11, pages 1391–1393 (1995). Saturation of the carrier concentration in the (Al,Ga,In)P material system has been reported by S. P. Najda et al in "Journal of Applied Physics" Vol. 82 No. 9, p. 4408 (1997).

Saturation of the free carrier concentration limits the number of electrons that can be injected into the active region of the laser device owing to carrier trapping at the DX level. This may lead to a charge imbalance, thereby reducing the efficiency of the laser device. Furthermore, saturation of the free carrier concentration in the n-doped cladding region 1 means that the electrical resistivity of the laser device cannot be reduced below a certain level.

This saturation of the carrier concentration is demonstrated in FIG. 8, which is taken from S. P. Najda et al (above). This figure shows experimental data on the silicon impurity concentration in $(Al_{0.7}Ga_{0.3})_{0.52}In_{0.48}P$ as a function of the temperature of the silicon cell. This Figure shows both the Hall carrier concentration (which is a measure of the free carrier concentration) and CV data (which is a measure of the fixed impurity concentration). It will be noted that the free carrier concentration (that is, the Hall carrier concentration) saturates at a concentration of $n=4.8\times10^{17}$ cm$^{-3}$. This saturation is due to pinning of the Fermi level at the DX level.

The potential barrier between the optical guiding region 2, 4 and the p-doped cladding region 5 in the laser structure of FIG. 2 is only around 50 mV. Because this potential difference is small, there is a significant leakage of carriers from the optical guiding region into the p-doped cladding region. It is therefore desirable to increase the potential barrier between the optical guiding region 2, 4 and the p-doped cladding region 5.

FIG. 3 shown one way in which the potential barrier between the optical guiding region 2, 4 and the p-doped cladding region 5 can be increased. In the laser structure of FIG. 3, the n-doped cladding region 1 and the p-doped cladding region 5 have a greater aluminum composition than the cladding regions 1, 5 of the laser structure shown in FIG. 2. The cladding regions 1, 5 in FIG. 3 are formed of $Al_{0.52}In_{0.48}P$. It will be seen that there is now a potential barrier of around 250 meV to the transport of Γ-electrons from the optical guiding region 2, 4 into the p-doped cladding region 5.

The use of an $Al_{0.52}In_{0.48}P$ cladding region in FIG. 3 has the disadvantage that the free carrier concentration is expected to saturate at e value lower than the saturation value in $(Al_{0.7}Ga_{0.3})_{0.52} In_{0.48}P$. The cladding regions 1, 5 in the laser restructure of FIG. 3 will therefore have a very high resistivity, and a significant amount of heat will be generated by resistive heating in the cladding regions when the device is in use. Such heat generation is undesirable.

When the laser devices of FIGS. 2 and 3 are in use, electrons are injected from the n-doped cladding region 1 into the optical guiding region 2, 4. For efficient lasing to occur, the electrons should be able to enter the quantum well active region 3 and reach thermal equilibrium. However, the electron distribution associated with electron injection into the optical guiding region 2, 4 has a non-thermal distribution, and this results in non-linear optical gain and hot carrier effects. P. Bhattacharya et al. "IEEE Journal of Quantum Electronics" Vol 32, No. 9, pages 1620–1628 (1996) propose that the problems associated with injecting carriers into the optical guiding region can be overcome by providing a thin potential barrier in the optical guiding region. Electrons that are injected into the optical guiding region reach the active region by tunnelling through the potential barrier, and this "cools" the electrons.

One disadvantage of the proposal by Bhattacharya et al (above) is that the thin potential barrier must be formed of a material that has a high aluminum content such as, for example, AlInP. A potential barrier formed of a material with a high aluminum content will create a quantum wall in the conduction band for X-electrons. Although electrons will be able to tunnel through the potential barrier, the X-electrons will be trapped in the quantum well formed in the potential barrier, and so will not be available for lasing in the active region. A further disadvantage of the proposal is that it results in a device in which a layer having a high aluminum content is disposed on one side of the active region and moreover is in the high gain part of the optical field. The refractive index of the potential barrier will be significantly different from the refractive index of the optical guiding region, owing to the large difference in their aluminum contents. Thus, the far-field image from such a device can be expected to be much more asymmetric than for the generic laser structure shown in FIG. 2.

A further problem with conventional edge-emitting lasers is that they have highly asymmetric far-field patterns. In many applications of edge-emitting lasers it is desirable for the far-field image to be substantially circular. For example, when an edge-emitting laser is used in a compact disc player, or when the output from an edge-emitting laser is coupled into an optical fibre, a substantially circular far-field profile is required. In order to use a conventional laser having an elliptical far-field profile in these applications it is necessary to provide correction optics. Typically, the asymmetric beam emitted by the laser is collimated, and is then passed through a pair of anamorphic prisms in order to obtain a near-circular far-field beam profile. The use of such correction optics increases the physical size, the complexity and the manufacturing cost of the system.

There have been a number of attempts to improve the aspect ratio of the beam emitted by an edge-emitting laser. S-T Yen et al, "IEEB Journal of Quantum Electronics" Vol 32, No. 9, pages 1588–1595 (1996) and G. Lin et al, "IEEE Photonico Technology Letters" Vol 8, No. 12, pages 1588–1590 (1996) have reported an InGaAs-AlGaAs laser having a vertical far-field of 13° and a lateral far-field of 8°, thus giving an: aspect ratio of approximately 1.6:1. (In comparison, a more typical aspect ratio for conventional lasers is approximately 3:1.)

According to P. Bhattacharya et al (above) and S-T Yen et al (above), many attempts to reduce the vertical far-field pattern below 15° will cause either side lobes in the far-field pattern or an increase in the threshold current of the laser.

SUMMARY OF THE INVENTION

A first aspect of the present invention provides a laser device comprising: an n-doped cladding region and a p-doped cladding region; an optical guiding region disposed between the n-doped cladding region and the p-doped cladding regions and an active region disposed within the optical guiding region;

wherein the laser device further comprises an optical confinement layer disposed between the active region and one of the cladding regions, the optical confinement region having a lower refractive index than the cladding region.

The provision of the optical confinement layer with a lower refractive index than the cladding regions will provide improved optical confinement and hence reduce the penetration of the optical field into the cladding region beyond the optical confinement region and concentrate the optical field in the active region. Reducing the extent to which the optical field penetrates the cladding region will reduce the absorption that occurs in the cladding region and will also increase the optical field in the active region. The combination of these two effects will reduce the threshold current of the laser device. Furthermore, reducing the penetration of the optical field into the cladding region will improve the circularity of the far-field image.

A further advantage accrues when the optical confinement layer is provided between the n-doped cladding region and the active region. In this case, when electrons are injected from the n-doped cladding region into the active region they will pass through the optical confinement region. In doing so, the electrons will be "cooled", and this will reduce carrier heating effects.

The optical confinement layer may be disposed at the interface between the optical guiding region and one of the cladding region.

The Γ-conduction band of the part of the one cladding region immediately adjacent the optical confinement layer may be substantially degenerate with the X-conduction band of the optical confinement layer.

The one cladding region may have a graded bandgap.

The composition of the one cladding region may be selected such that the energy of the DX level in the one cladding region is greater than the Fermi level in the one cladding region. This can be achieved by using a direct bandgap material to form the cladding region. The DX level will not be significantly populated in this case, so that carrier trapping in the DX level will be substantially reduced.

Alternatively, the DX level in the part of the one cladding region adjacent the optical confinement layer may be substantially degenerate with the X-conduction band in the optical confinement layer. This increases the probability that carriers trapped in the DX level will tunnel out of the DX level into the X-conduction band of the optical confinement layer, and so reduces the trapping of carriers in the DX level.

The energy of the DX level in the one cladding region may increase away from the optical confinement layer. Grading the energy of the DX level in this way also increases the probability that carriers trapped in the DX level will tunnel out of the DX level into the X-conduction band of the optical confinement layer, and so reduces the trapping of carriers in the DX level.

The optical confinement layer may be disposed on the p-side of the laser device and may be p-doped. Band bending will occur if the optical confinement layer is heavily p-doped, and this band bending will increase the potential barrier to the transport of Γ-electrons from the active region into the p-doped cladding region. Doping an optical confinement layer on the p-side of the device to be p-type will also facilitate the transport of holes from the p-doped cladding region into the optical guiding region and thus into the active region.

The laser device may comprise a second optical confinement layer disposed between the active region and the other of the cladding regions. The second optical confinement layer may be disposed at the interface between the optical guiding region and the other of the cladding regions.

The laser device may be fabricated in the (Al,Ga,In)P system, with the one cladding region being formed of AlGaInP having an aluminum mole fraction y. (It lattice matching to a GaAs substrate were required, the cladding layer would preferably be $(Al_yGa_{1-y})_{0.52}In_{0.48}P$.)

The value of y may decrease away from the optical confinement layer.

The or each optical confinement layer may be an AlGaInP layer having a higher aluminum mole fraction than the one cladding layer. Alternatively, the or each optical confinement layer may be an AlInP layer. AlInP has a low refractive index of 3.253 (M. Moser et al "Applied Physics Letters" Vol 64, No. 2, p. 235 (1994)), and thus provides good confinement of the optical field.

The or each optical confinement layer may consist of oxidised AlInP. Oxidising AlInP decreases its refractive index, so that using an optical confinement layer of oxidised AlInP will provide a further improvement in optical confinement.

The value of y may be approximately 0.4 at the interface between the one cladding region and the optical confinement layer. The Γ-band of the cladding layer at the interface with an AlInP optical confinement layer is then substantially degenerate with the X-band of the optical confinement layer.

Alternatively, y may be approximately 0.9 at the interface between the one cladding region and the optical confinement layer. The DX level of the cladding layer at the interface with an AlInP optical confinement layer is then substantially degenerate with the X-band of the optical confinement layer.

The thicknesses of the optical guiding region and the or each optical confinement layer may be selected such that the laser device emits, in use, light having a substantially circular far-field-profile. Light emitted form such as laser device can be coupled directly into an optical fibre or used in a CD player, and the need to use corrective optics is eliminated.

A second aspect of the present invention provides a semiconductor laser device comprising an n-doped cladding region and a p-doped cladding region; an optical guiding region disposed between the n-doped cladding region and the p-doped cladding region; and an active region disposed within the optical guiding region; wherein the composition of one of the cladding regions is selected such that the energy of the DX level in the one cladding region is greater than the Fermi level in the one cladding region. The DX level will not be significantly populated in this case, so that carrier trapping in the DX level will be substantially reduced. The one cladding region may have a direct bandgap. The laser device may be fabricated in the (Al,Ga,In)P alloy system and the one cladding region may be formed of AlGaInP having an aluminum mole fraction y, where y<0.55.

A third aspect of the present invention provides a semiconductor laser device comprising: an n-doped cladding region and a p-doped cladding region; an optical guiding region disposed between the n-doped cladding region and the p-doped cladding region and an active region disposed within the optical guiding region; wherein the energy of the DX level in one of the cladding region, increases away from the optical guiding region. Grading the energy of the DX level in this way increases tho probability that carriers trapped in the DX level will tunnel out of the DX level into the optical guiding region, and so reduces the trapping of carriers in the DX level.

The laser device may be fabricated in the (Al,Ga,In)P alloy system, wherein the one cladding region is formed of AlGaInP having an aluminum mole fraction y, and wherein y decreases away from the optical guiding region.

The laser device may emit light in the visible range. The laser device, in one embodiment, emits light in the range from about 630 nm to about 680 nm. The laser device, in one embodiment, emits light is in the range from about 635 nm to about 650 nm.

The laser device may have a symmetrical structure. The laser device, in one embodiment, has a circular or elliptical far-field profile.

The laser device, in one embodiment, comprises two optical guiding regions having the same thickness. The laser device, in one embodiment, comprises two optical guiding regions having the same composition.

BRIEF DESCRIPTION OF THE DRAWINGS

Preferred embodiments of the present invention will now be described by way of illustrative example with reference to the accompanying Figures in which:

FIG. 14(b) shows the optical confinement of the laser device whose far-field emission is shown in FIG. 14(a).

DETAILED DESCRIPTION

Figure 4:
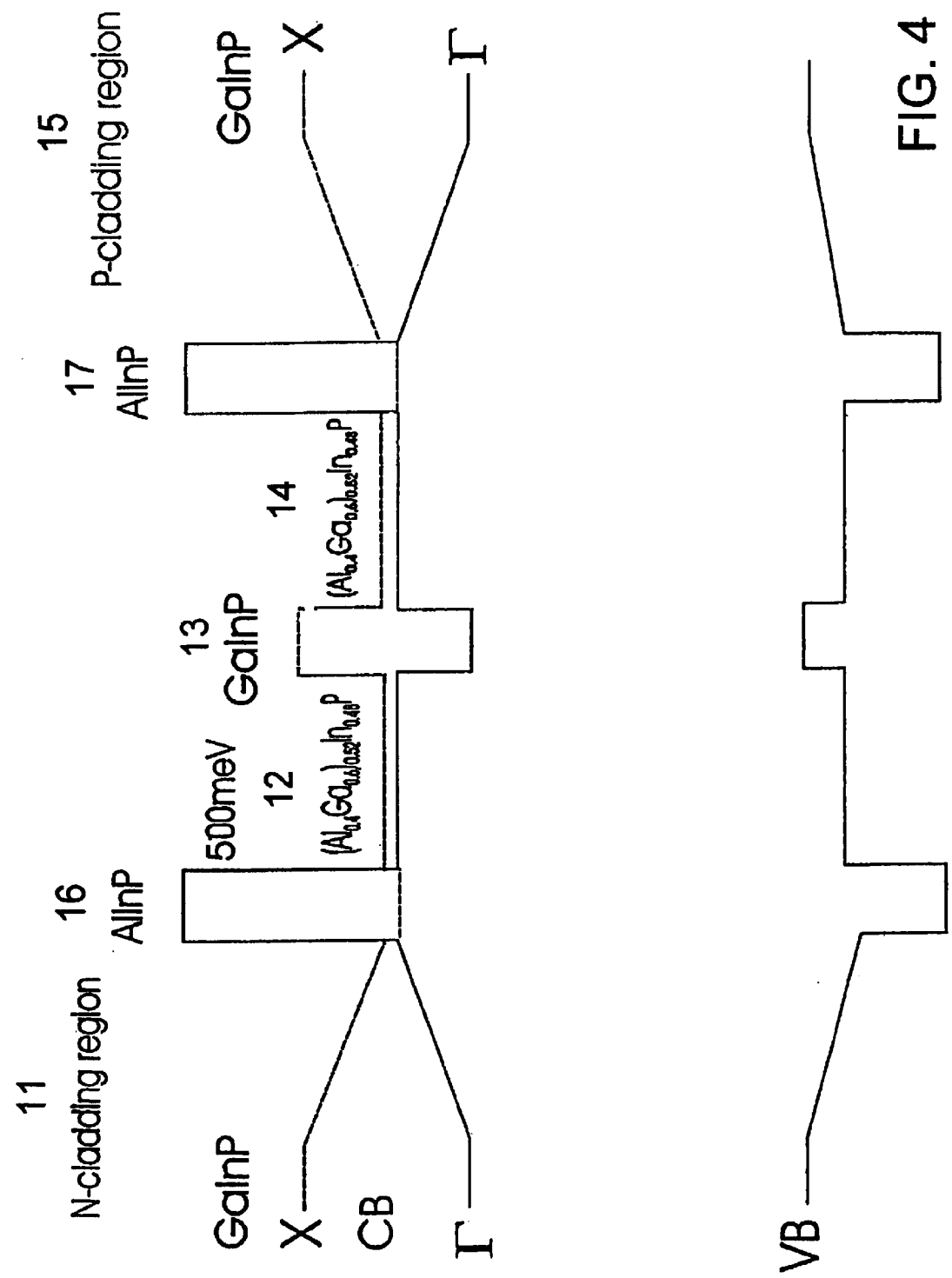
FIG. 4 Is a schematic band structure diagram of a SCH laser according to first embodiment of the present invention.

The band structure of a SCH laser device according to a first embodiment of the present invention is shown schematically in FIG. 4. This laser device consists of a $Ga_{0.52}In_{0.48}P$ active region 13 disposed within an optical guiding region 12, 14. The optical guiding region 12, 14 is formed of $(Al_{0.4}Ga_{0.6})_{0.52}In_{0.48}P$. The optical guiding region 12, 14 Is disposed between an n-doped cladding region 11 and a p-doped cladding region 15.

The laser device of this embodiment is provided with two optical confinement layers 16, 17. In this embodiment these are formed of a $Al_{0.52}In_{0.48}P$; one optical confinement layer is disposed at the interface between the n-doped cladding region and the optical guiding region, and the other is disposed at the interface between the p-doped cladding region 15 and the optical guiding region.

In this embodiment, the cladding regions 11, 15 each have a graded structure. At its interface with the optical confinement layer 16, the n-doped cladding region 11 consists of $(Al_{0.4}Ga_{0.6})_{0.52}In_{0.48}P$. The aluminum content of the n-doped cladding region decreases away from the interface with the optical confinement layer 16, eventually becoming zero to give a composition for the cladding region of $Ga_{0.52}In_{0.48}P$. The composition of the p-doped cladding region 15 has a similar variation, with the aluminum mole fraction being y=0.4 at the interface with the optical confinement layer 17 and decreasing to zero away from the interface with the confinement region 17.

Providing the optical confinement layers 16, 17 has a number of advantages. Firstly, the refractive index of AlInP is approximately 5.74 lower than the refractive index of the $(Al_{0.4}Ga_{0.6})_{0.52}In_{0.48}P$ optical guiding layer 12, 14. In contrast, in the conventional laser shown in FIG. 2, the refractive index of the $(Al_{0.5}Ga_{0.5})_{0.52}In_{0.48}P$ cladding regions 1, 5 is only around 2% lower than the refractive index of the $(Al_{0.5}Ga_{0.5})_{0.52}In_{0.48}P$ optical guiding region 2, 4. The much larger refractive index difference in the laser of FIG. 4 means that there will be greatly improved confinement of the optical field, so that penetration of the optical field into the cladding regions 11, 15 will be greatly reduced. This will reduce absorption that occurs in the cladding region, and also will increase the optical field in the active region. This reduces the threshold current of the laser device.

Figure 2:
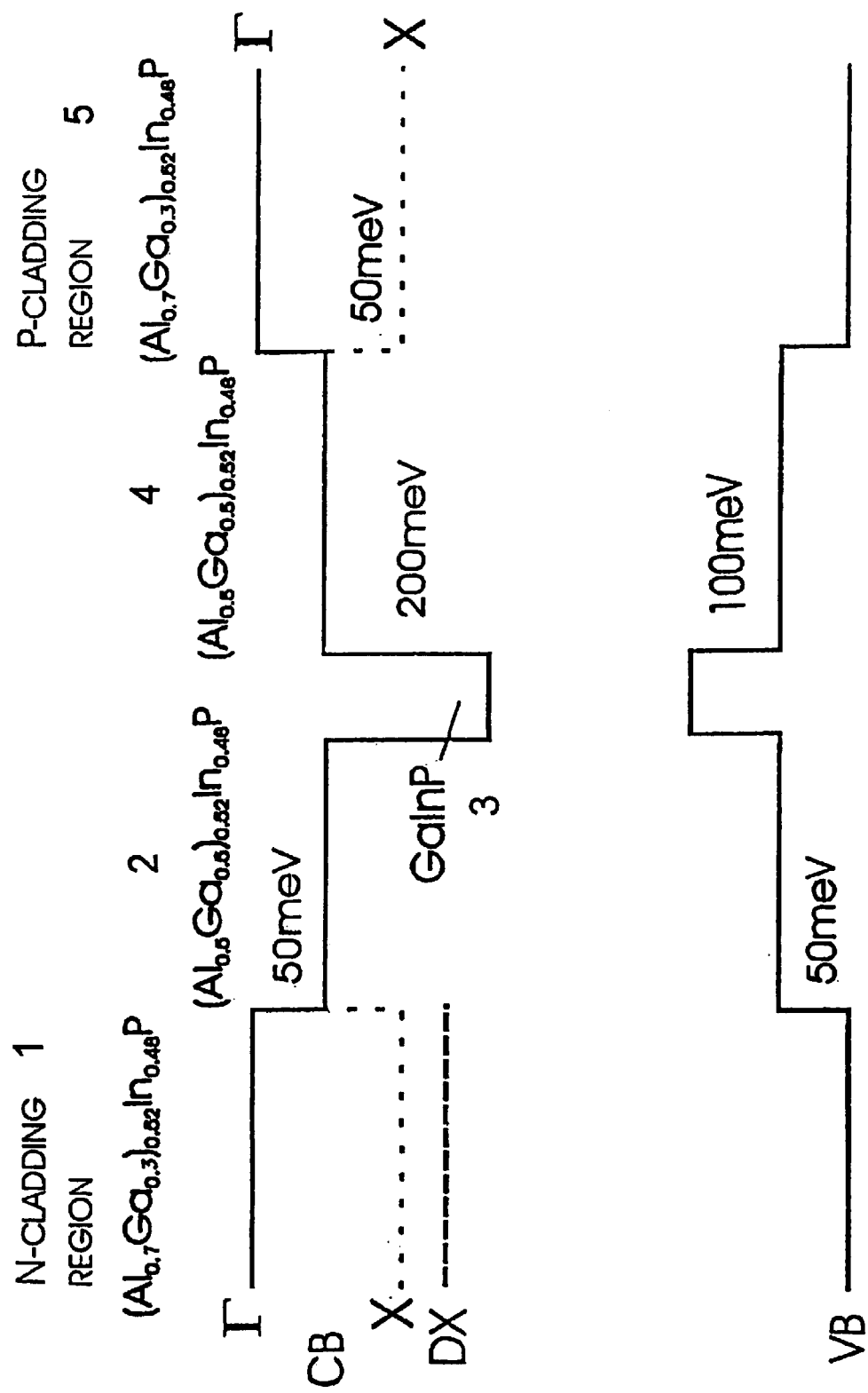
FIG. 2 is a schematic band structure of a conventional separate confinement heterostructure semiconductor laser fabricated in the (Al,Ga,in)P system.

Moreover, the improved optical confinement allow the vertical far-field pattern to be much narrower compared with the far-field pattern of the conventional laser device of FIG. 2. This can make the far-field beam profile more circular.

In the laser device shown in FIG. 4 electrons are injected into the optical guiding region from the n-doped cladding region 11 via the X-conduction band in the AlInP optical confinement layer 16. It will be noted that the X-band in the optical confinement layer 16 is substantially degenerate with the Γ-band of the optical guiding region 12, 14. Moreover, at the interface between the n-doped cladding region 11 and the optical confinement layer 16 the Γ-band of the n-cladding region 11 also is degenerate with the X-band of the optical confinement layer 16. The electrons injected from the n-doped cladding region 11 into the optical guiding region will be "cooled" as a result of their passage through the X-band of the optical confinement layer 16, and this will reduce hot electron effects compared with the conventional structures shown in FIGS. 2 and 3.

In the laser device shown in FIG. 4, the cladding regions are formed of a material that has a direct bandgap. In the embodiment of FIG. 4, the maximum aluminum mole fraction in the (Al,Ga,In)P cladding regions is y=0.4, whereas the transition from a direct bandgap material to an indirect bandgap material occurs at y=0.55. Since the cladding regions have a direct bandgap, the DX level is always above the Fermi level. The carrier saturation effect discussed above with reference to the conventional laser of FIG. 2 therefore does not occur, so that the free carrier concentration in the n-doped cladding region 11 of the laser device of FIG. 4 will be greater than the free carrier concentration of the n-doped cladding region 1 in FIG. 2.

It is possible to reduce the aluminum mole fraction in the cladding regions in the device of FIG. 4 below 0.55, so that the cladding regions have a direct bandgap, because the optical confinement layers 16, 17 are provided. As is clear from FIG. 4, the optical confinement layers also provide a potential barrier to confine Γ-electrons with the optical guiding region 12, 14, 90 that the cladding regions do not need to be able to confine Γ-electrons in the optical guiding region. In consequence, the conduction band discontinuity between the optical guiding region and the cladding region in a laser of the present invention can be lower than in a conventional laser of the type shown in FIGS. 2 and 3, and this means that the aluminum mole fraction of the cladding regions can be lower In the present invention.

Although the optical guiding region in FIG. 4 has an aluminum mole fraction of 0.4, the invention is not limited to this. For example, the aluminum mole fraction in the optical guiding region could be reduced from 0.4 to 0.3 (as in FIG. 12) so as to provide a larger potential barrier for confining Γ-electrons within the optical guiding region.

The optical confinement regions will have a high resistivity, owing to their high aluminum mole fraction. However, the optical confinement regions will have a thickness of the order of 100 nm whereas the cladding regions will have a thickness of the order of 1 μm. Thus, the overall resistance of the device shown in FIG. 4 will be considerably lower than the overall resistance of the conventional devices shown in FIGS. 2 and 3.

The optical confinement layers 16, 17 are preferably undoped, since this will prevent DX trapping occurring in the optical confinement layers. It is possible, however, for the optical confinement regions 16, 17 to be doped. There should be no significant change in the transport properties of the device, compared to a device having undoped optical confinement layers, if the optical confinement layers are thin and highly doped.

In the embodiment of FIG. 4, the optical confinement layers 16, 17 are un-doped. It is possible, however, to dope the optical confinement layer 17 an the p-side of the laser so that it is heavily p-doped. This will cause band banding and so increase the potential barrier opposing electron transport from the optical guiding region 12, 14 to the p-doped cladding region 15, and It will also facilitate the transport of holes from the p-doped cladding region 15 into the optical guiding region 12, 14.

Figure 7:
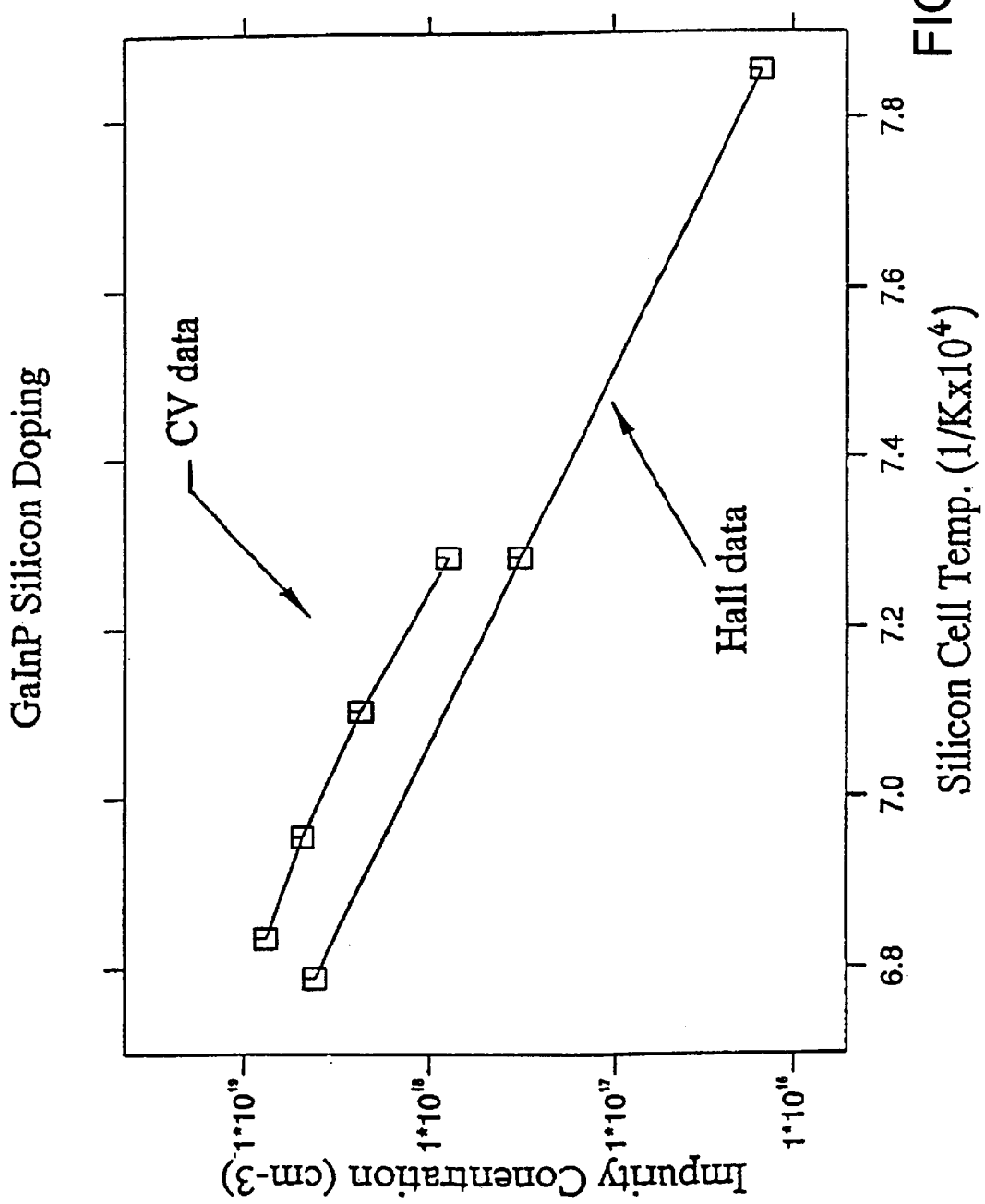
FIG. 7 shows the silicon impurity concentration in GaInP as a function of the temperature of the silicon cell.
Figure 8:
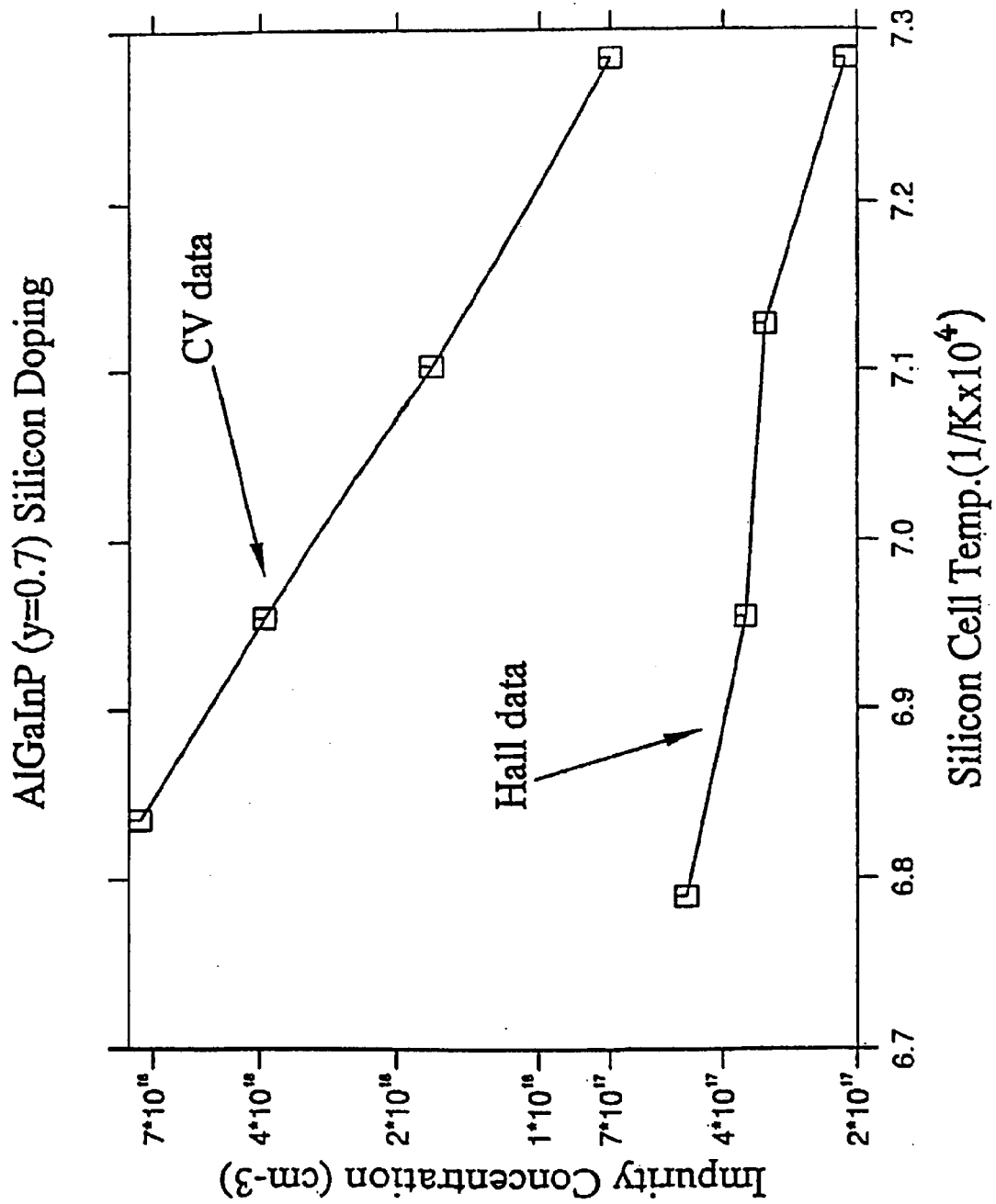
FIG. 8 shows the silicon impurity concentration in $(Al_{0.7}Ga_{0.3})_{0.52}In_{0.48}P$ as a function of the temperature of the silicon cell.

FIG. 7 shows the impurity concentration of GaInP that is doped with Si, as a function of the silicon cell temperature. FIG. 7 shows both the free carrier density as determined by a Hall effect measurement, and the fixed impurity carrier density as determined by a CV measurement. It will be noted that a high free electron concentration, having a value of up to approximately $n=5\times10^{10}$ cm$^{-3}$ is obtained in GaInP. No saturation of the free carrier concentration is observed in GaInP. This is in contrast to the data for $(Al_{0.7}Ga_{0.3})_{0.52}In_{0.48}P$ which in shown in FIG. 8—an discussed above, saturation occurs in the Hall effect data of FIG. 8 and there is a maximum free carrier concentration of around $4.8\times10^{17}$ cm$^{-3}$.

Figure 9:
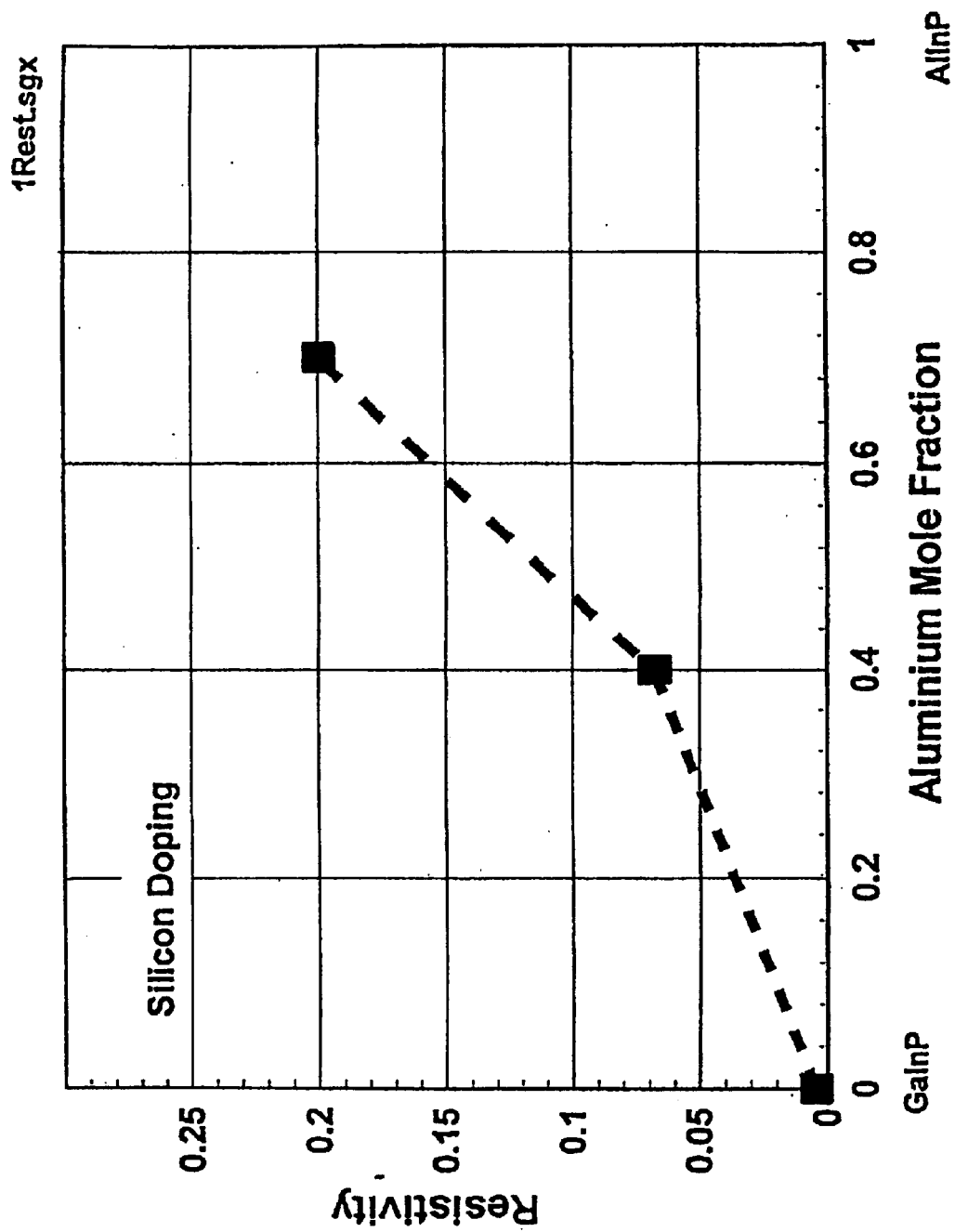
FIG. 9 shows the resistivity of $(Al_yGa_{1-y})_{0.52}In_{0.48}P$ doped with silicon an a function of the aluminum mole fraction y.
Figure 10:
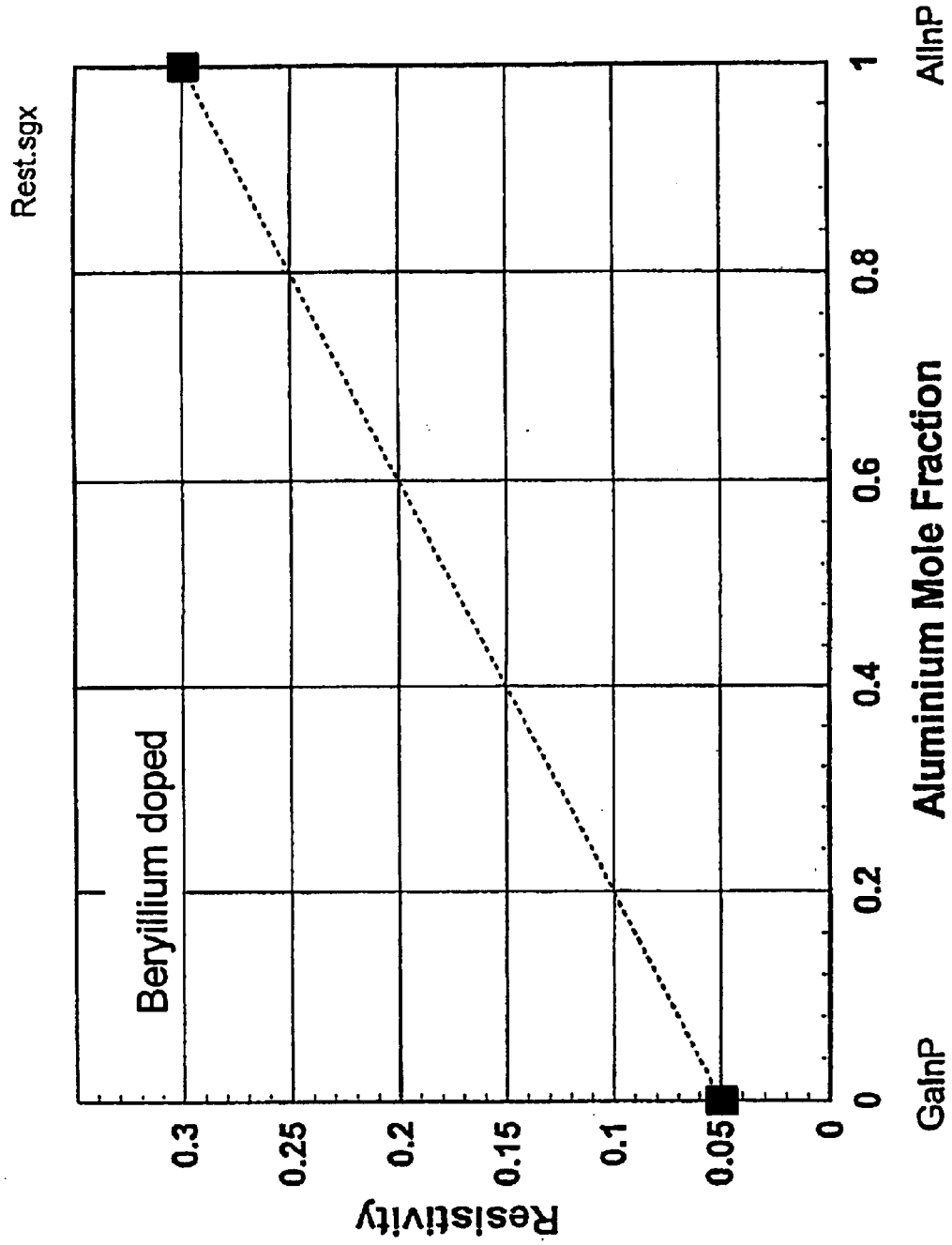
FIG. 10 shows the resistivity of $(Al_yG_{1-y})_{0.52}In_{0.48}P$ doped with beryllium as a function of the aluminum mole fraction y.

The resistivity of $(Al_yGa_{1-y})_{0.52}In_{0.48}P$ is shown in FIG. 9 for silicon doped material and in FIG. 10 for beryllium doped material. Both Figures show the resistivity as a function of the aluminum mole fraction. It will be noted that the resistivity of silicon-doped GaInP is approximately 0.002 $\Omega$/cm. The resistivity increases as the aluminum mole fraction is increased, and it increases by around two orders of magnitude to approximately 0.2 $\Omega$/cm at an aluminum mole fraction of $y\neq0.7$. The resistivity at an aluminum mole fraction of $y\neq0.4$ has been measured at 0.068 $\Omega$/cm, which is a factor of 3 lower than the resistivity at an aluminum mole fraction of $y\neq0.7$.

The results for the resistivity of beryllium doped $(Al_yGa_{1-y})_{0.52}In_{0.48}P$, shown in FIG. 10, also show a clear increase in resistivity an the aluminum mole fraction increases. The resistivity is approximately 0.22 $\Omega$/cm at an aluminum mole fraction of y=0.7 as used in the cladding regions of a conventional laser device in the (Al,Ga,In)P system. This reduces to around 0.15 $\Omega$/cm for an aluminum mole fraction of $y\neq0.4$—a reduction of around 32%.

Figure 3:
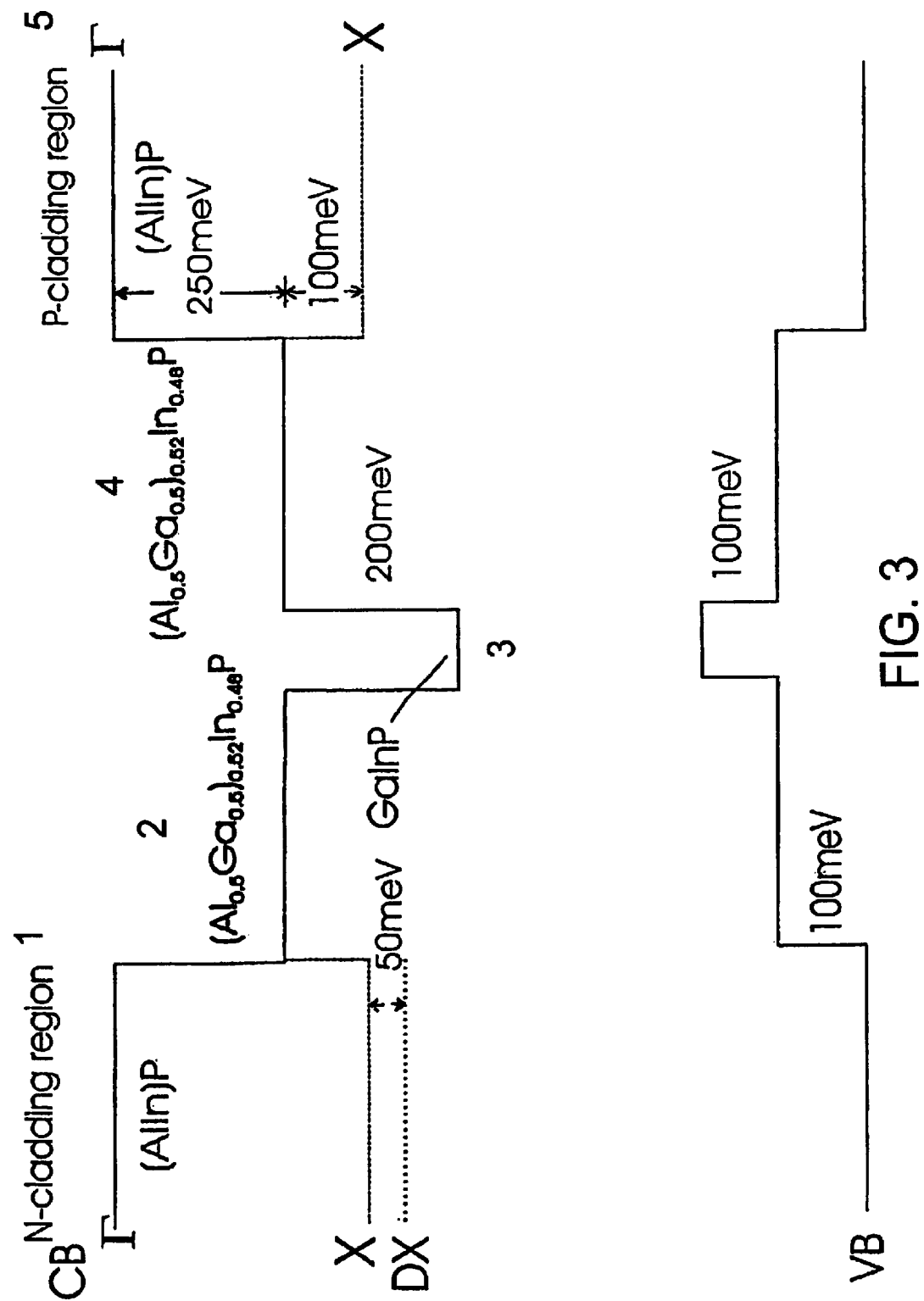
FIG. 3 is a schematic band structure diagram of a SCH laser similar to that shown in FIG. 2, but in which the cladding layers are formed of (Al,In)P.

The results of FIGS. 9 and 10 show that the cladding region of the laser device shown in FIG. 4 of this application will have a considerably lower resistivity than the cladding regions of the conventional laser devices shown in FIGS. 2 and 3 of this application. This reduces the resistive heating that occurs in the cladding layers during operation of the laser device. (Although FIGS. 9 and 10 relate only to silicon or beryllium doped material, the resistivity of AlGaInP generally increases with increasing aluminum mole fraction when other dopants are used.

Figure 5:
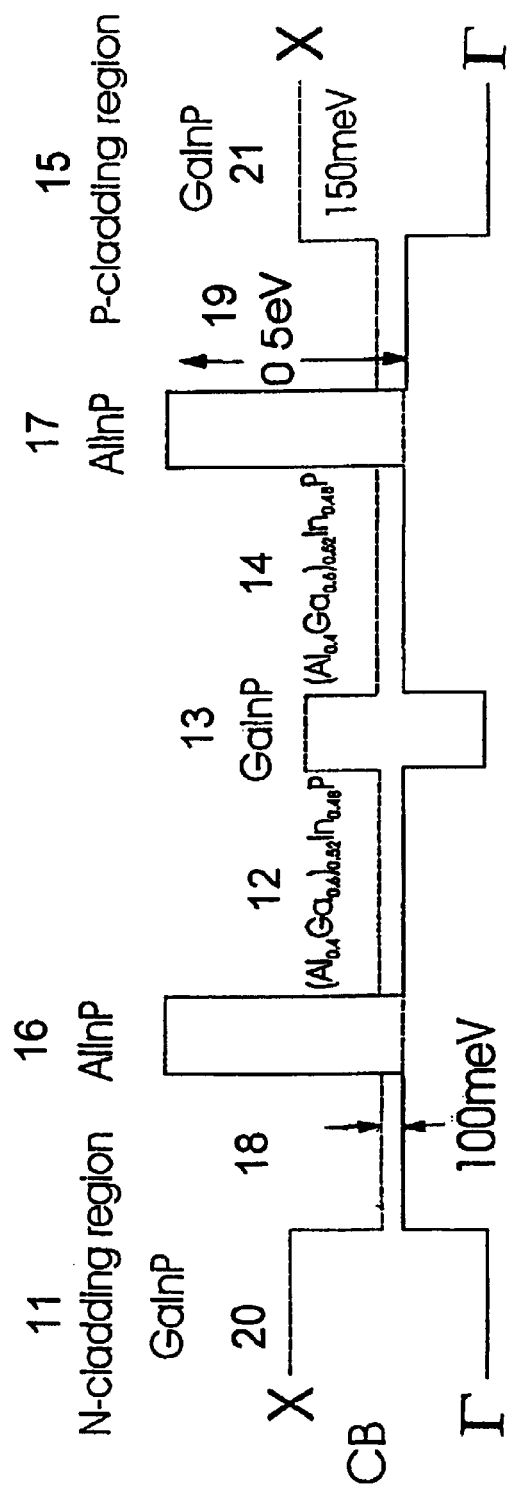
FIG. 5 Is a schematic band structure diagram of a SCH laser according to a second embodiment of the present invention.
Figure 5:
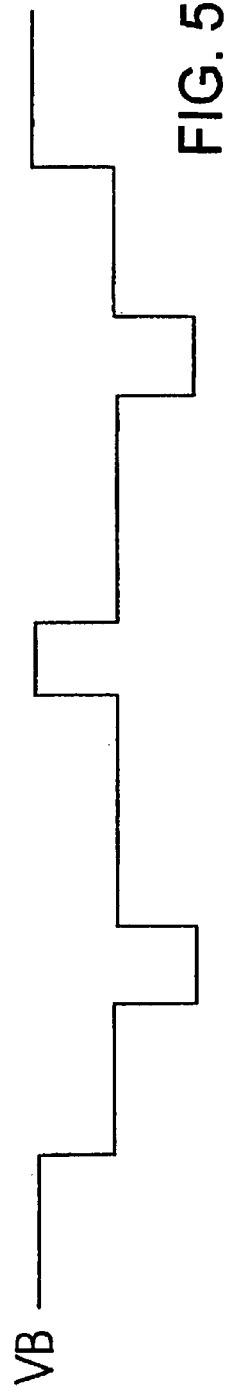

FIG. 5 shows a laser device according to a second embodiment of the present invention. This is generally similar to the laser device of FIG. 4. except that the graded bandgap cladding regions of the laser of FIG. 4 are replaced by cladding regions which are made up of a layer 18, 19 of $(Al_{0.4}Ga_{0.5})_{0.52}In_{0.48}P$ disposed adjacent to the optical confinement layers 16, 17, and a layer of GaInP 20, 21.

In the laser device of FIG. 5, the aluminum mole fraction of the optical guiding region 12,14 can be reduced from $y\neq0.4$ to y=0.3 to increase the carrier confinement potential barrier. Γ-electrons are confined by the optical confinement layers 16, 17.

Adopting the cladding layers shown in the laser device of FIG. 5 simplifies the growth process of the laser device while retaining the advantages of the laser device shown in FIG. 4.

Figure 6:
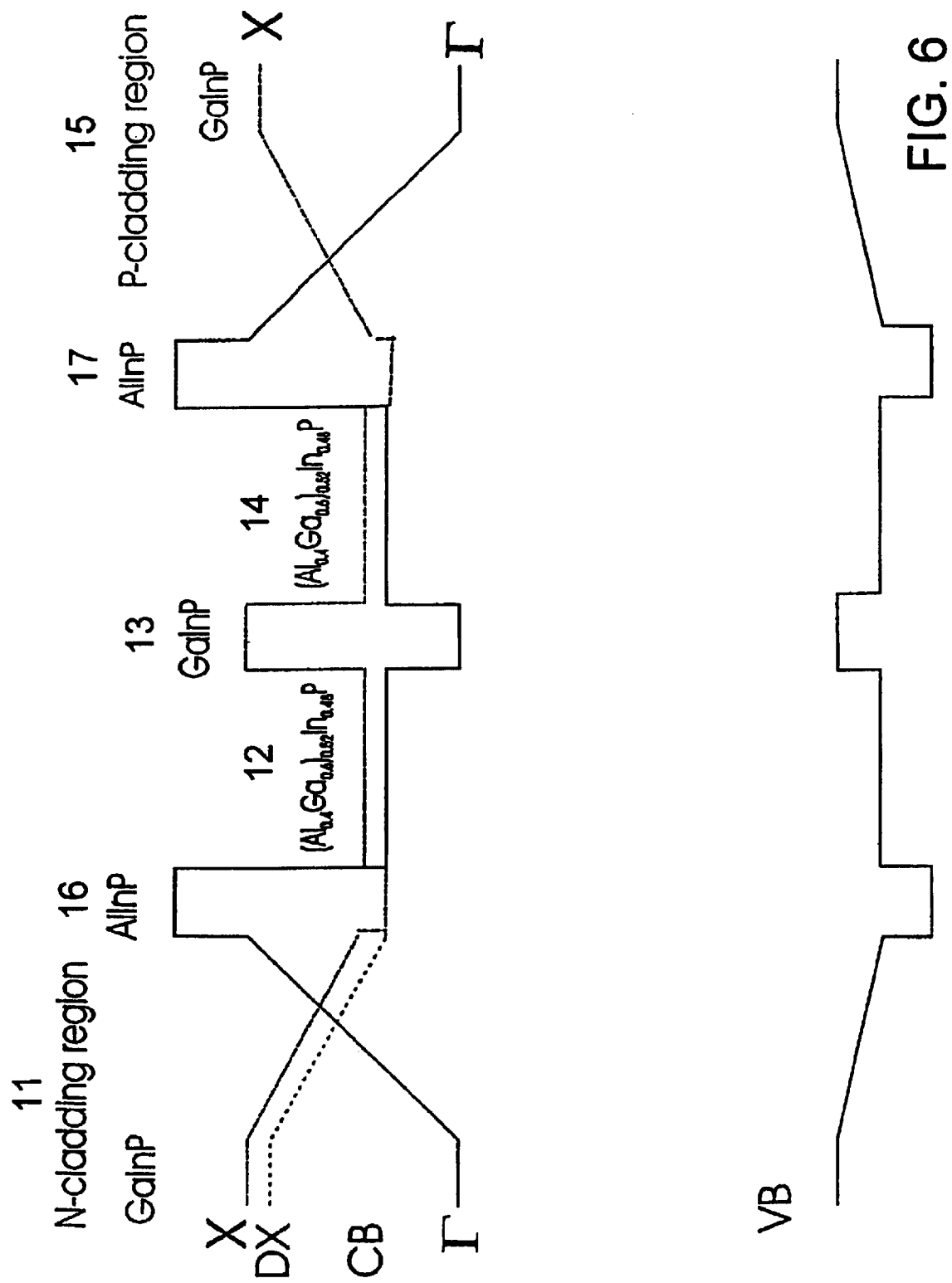
FIG. 6 is a schematic band structure diagram of a SCH laser according to a third embodiment of the present invention.

FIG. 6 is a schematic band structure diagram of a SCH laser device according to a third embodiment of the present invention. As with the devices shown in FIGS. 4 and 5, the laser device of FIG. 6 has a GaInP active region 13 arranged in an $(Al_{0.4}Ga_{0.6})_{0.52}In_{0.48}P$ optical guiding region 12, 14. AlInP optical confinement layers 16, 17 are provided at each end of the optical guiding region 12, 14. Finally, the device in provided with an n-doped cladding region 11 and a p-doped cladding region 15.

The cladding region 11, 15 in the laser device of FIG. 6 have a graded composition. At the interface between the cladding regions 11, 15 and the optical confinement layers 16, 17, the cladding regions have the composition $(Al_yGa_{1-y})_{0.52}In_{0.48}P$ where y is approximately 0.9. The aluminum mole fraction, y, decreases away from the interface between the cladding regions and the optical confinement layers 16, 17, and eventually becomes zero so that the cladding regions well away from the interface with the optical confinement layers consist of GaInP.

The aluminum mole fraction, y, of the cladding regions at their interface with the optical confinement layers is chosen such that the DX level in the cladding regions, which is approximately 100 meV below the X-band is degenerate with the X-band in the AlInP, optical confinement layers 16, 17. This increases the probability that electrons trapped in the DX level can tunnel out of the DX level into the X-conduction band of the AlInP optical confinement layers 16, 17. Furthermore, the grading of the composition of the cladding region increases the ionisation of carriers trapped in the DX level that occurs when an electric field is applied during operation of the laser device.

Figure 11A:
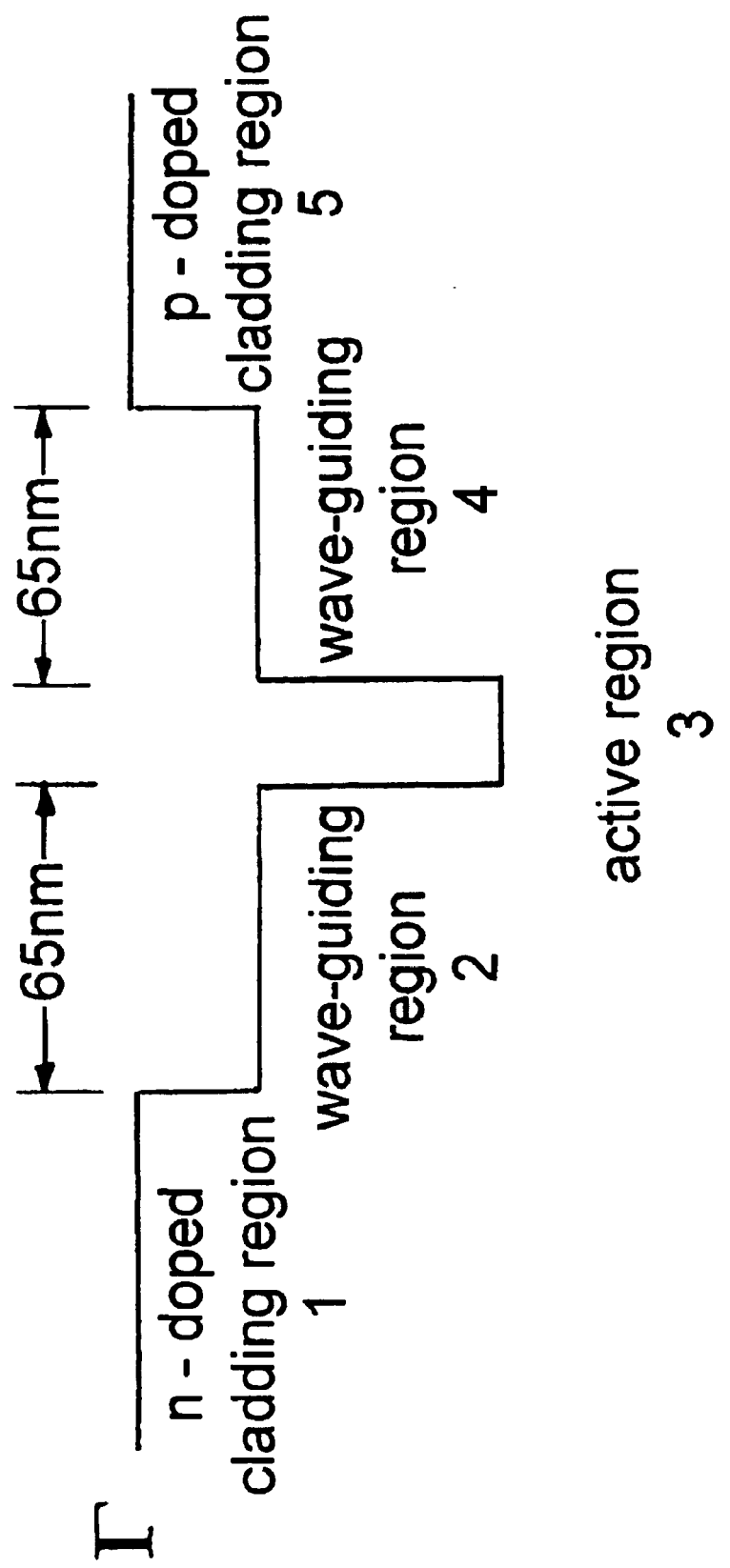
FIG. 11(a) is a schematic view of the conduction band structure of another conventional SCH laser device fabricated in the (Al,Ga,In)P system.
Figure 11B:
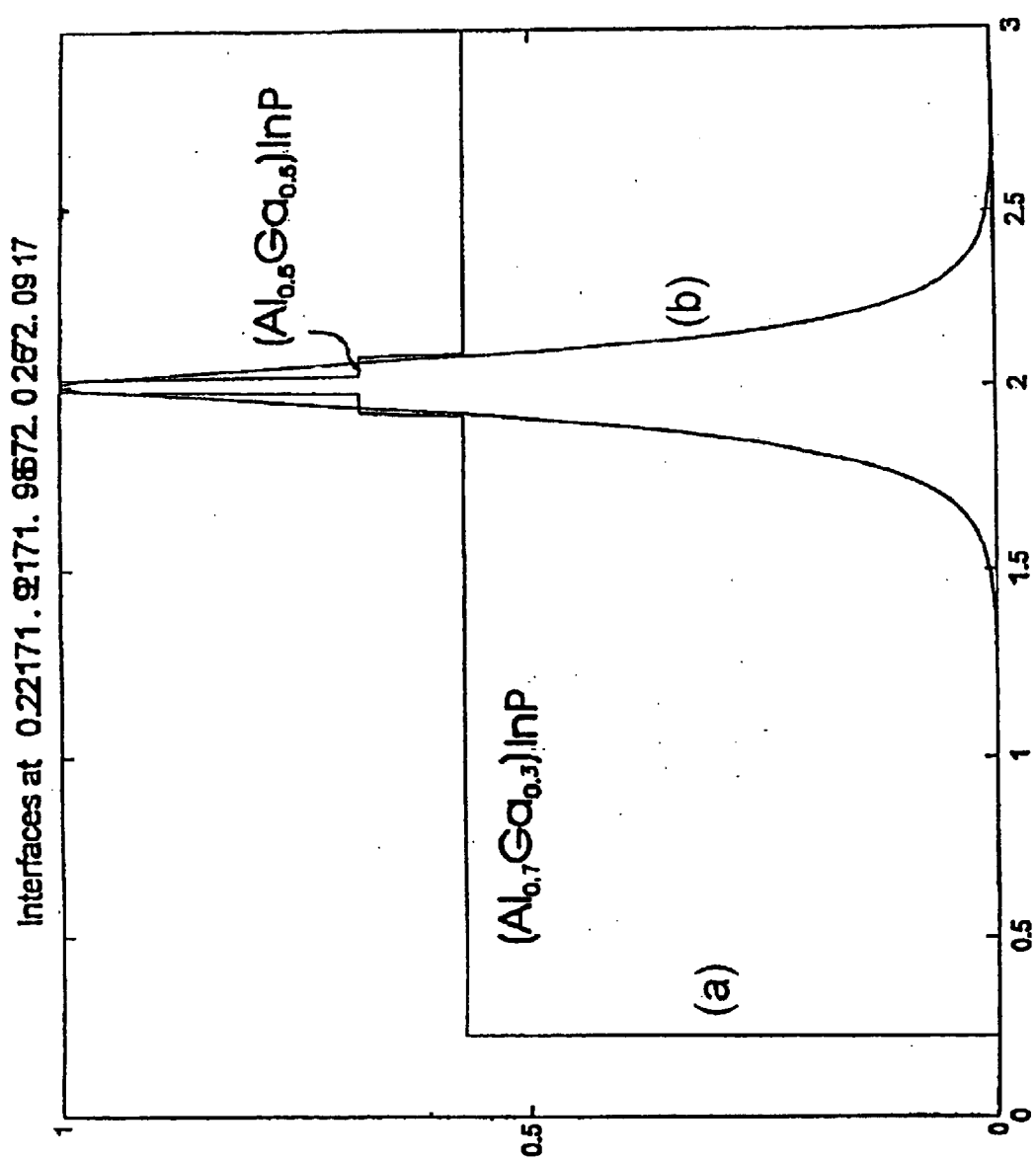
FIG. 11(b) shows the refractive index profile and the near-field profile of the laser device of FIG. 11(a)

FIG. 11(a) is a schematic diagram of the Γ-conduction band structure of another conventional SCH laser structure (the X-band Is omitted for clarity), and FIG. 11(b) shows the refractive index profile (a) and the optical field normalised to unity (b) of the laser of FIG. 11(a). The laser of FIG. 11(a) consists of 1.7 $\mu$m thick $(Al_{0.7}Ga_{0.3})_{0.52}In_{0.48}P$ cladding regions 1,5, 65 nm thick waveguiding regions 2,4 formed of $(Al_{0.5}Ga_{0.5})_{0.52}In_{0.48}P$, and a 3×10 nm GaInP quantum well active region 3.

The x-axis of FIG. 11(b) represents distance from the substrate in M. The n-type cladding region 1 commences at x=0.2217 (i.e. at 0.2217 $\mu$m from the substrate), and the interface between the n-doped cladding region and the waveguiding region 2 is at x=1.9217. The active region extends from x=1.9867 to x=2.0267. The interface between the waveguiding region 4 and the p-type guiding region in at x=2.0917. The p-type cladding region is not shown in its entirety in FIG. 11(b).

It will be noted that the near-field beam profile shown in FIG. 11(b) extends considerably into the cladding regions of the laser device. Only about 604 of the optical field is confined in the waveguiding regions and the active region, so that approximately 40% of the optical field penetrates into the cladding regions. About 16.70 of the optical field is confined in the active region itself. This labor device baa a far-field perpendicular component of 28° and a far-field parallel component of about 8°.

The large penetration of the optical field into the doped cladding regions means that absorption will occur in the cladding regions. This increases the threshold current of the laser device.

Figure 12:
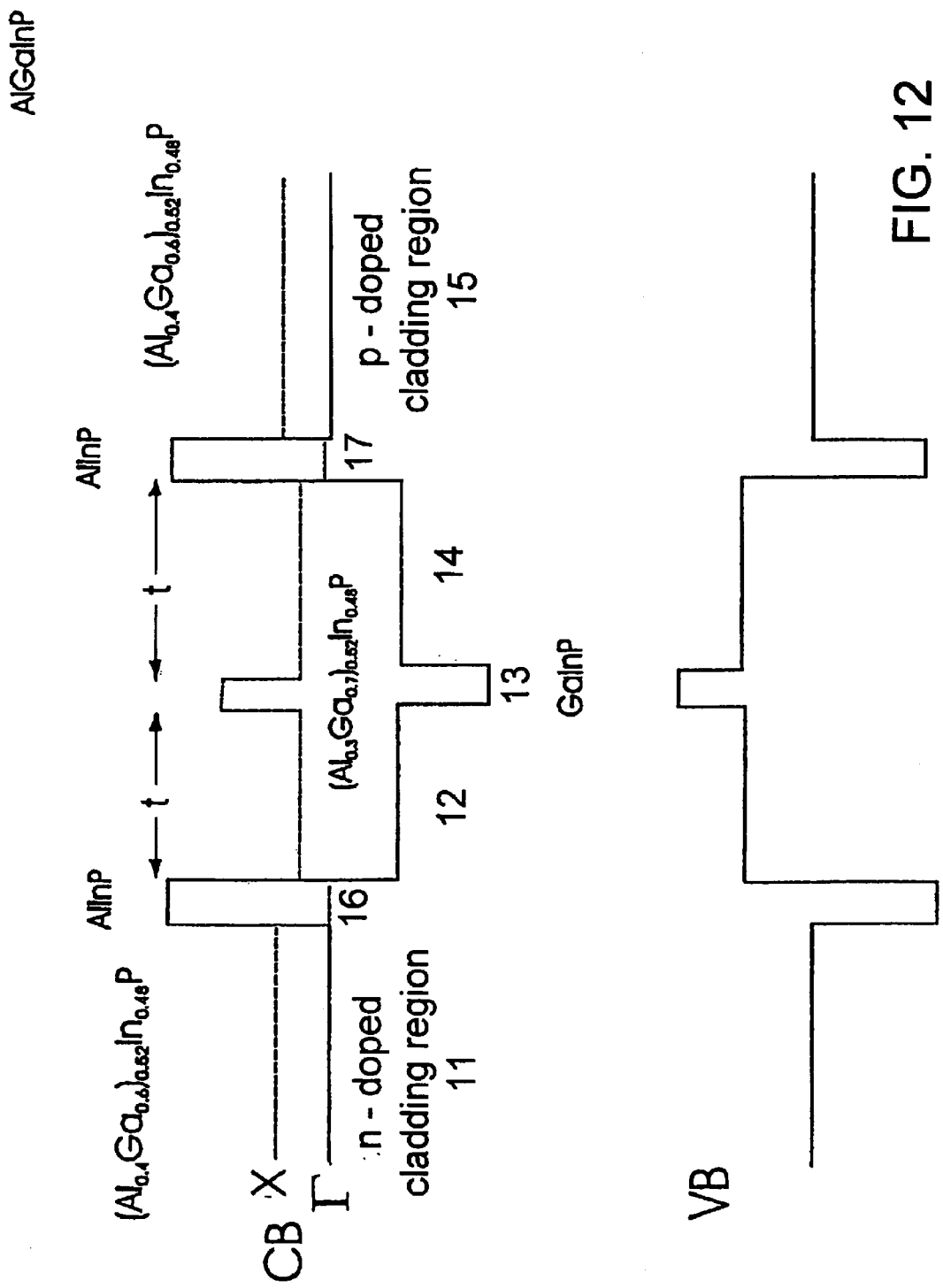
FIG. 12 is a schematic band structure diagram of a SCH laser device according to a further embodiment of the present invention.

FIG. 12 is a schematic band structure diagram of a SCH laser device according to a fourth embodiment of the present invention. This consists of an n-doped $(Al_{0.4}Ga_{0.4})^{0.52}In_{0.48}P$ cladding region 11, an AlInP optical confinement region 16, an $(Al_{0.3}Ga_{0.7})_{0.52}In_{0.48}P$ waveguiding region 12, a GaInP active region 13, a second $(Al_{0.3}Ga_{0.7})_{0.52}In_{0.48}P$ waveguiding region 14, a second AlInP optical confinement region 17, and a p-doped $(Al_{0.4}Ga_{0.6})_{0.52}In_{0.48}P$ cladding region 15.

Figure 13A:
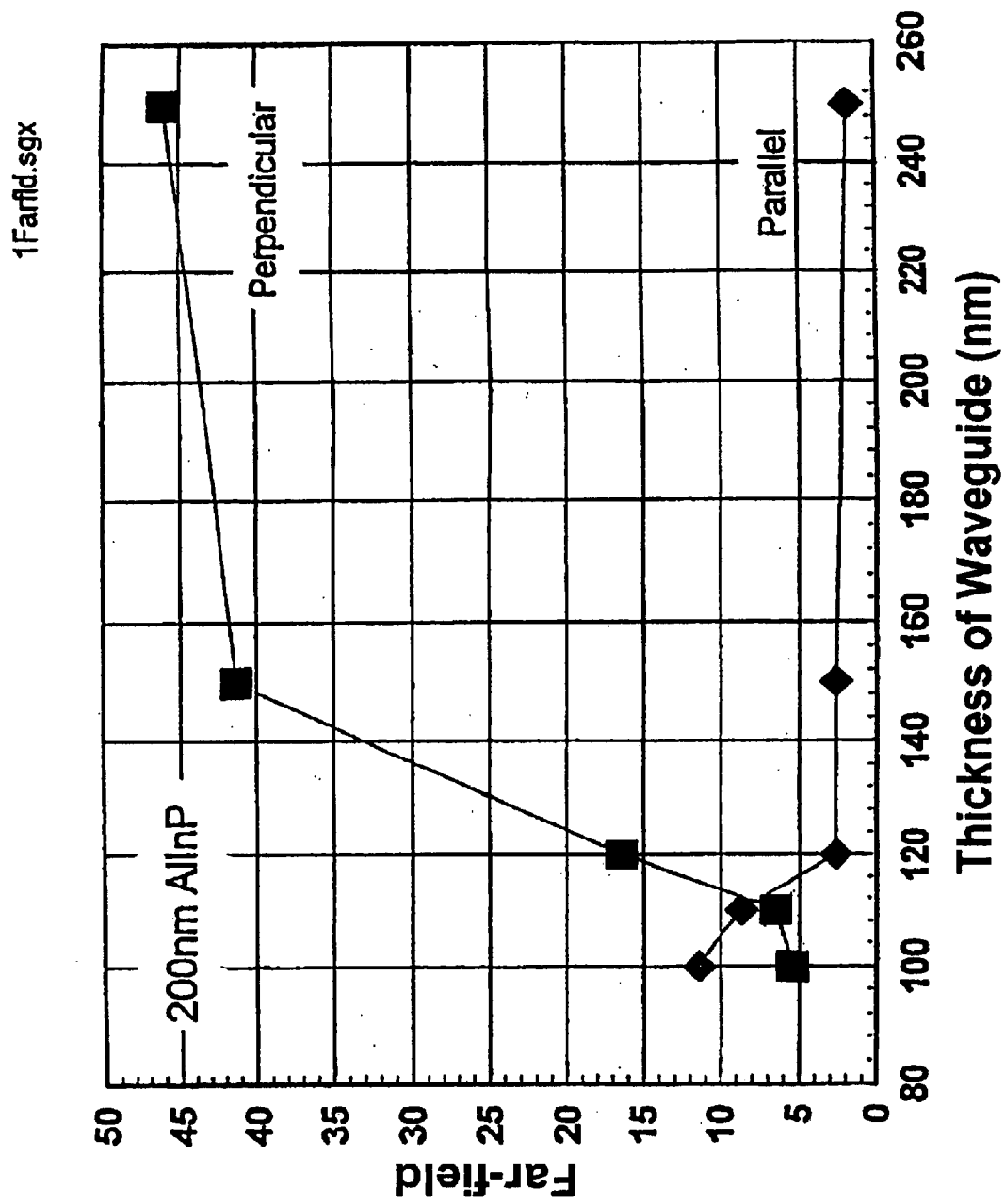
FIG. 13(a) shows the perpendicular and parallel components of the far-field emission of the laser device of FIG. 12.

FIG. 13(a) shows the perpendicular and parallel components of the far-field optical beam emitted by the laser device of FIG. 12. The results are for a laser device in which the AlInP optical confinement layers 16, 17 have a thickness of 200 nm, and the active region 13 contains 3×10 nm GaInP quantum wells. It will be seen that the perpendicular and parallel components of the far-field depend on the thickness (t) of the waveguiding regions, and that the perpendicular and parallel components are equal when the waveguiding regions each have a thickness of approximately 118 nm. For this thickness, the perpendicular component and parallel component each have a width of approximately 8°, so that a substantially circular far-field beam is obtained.

It will be noted that if the thickness of the optical guiding region is increased, the perpendicular far-field component becomes greater than the parallel far-field component. In particular, for waveguiding regions having a thickness of greater than 140 nm, the far-field profile in highly elliptical with a perpendicular component of approximately 400 and a parallel component of around 3–4°.

As shown in FIG. 13(a), the laser device comprises two optical guiding regions 12, 14, and the active region 13. In one embodiment, the two optical guiding regions are symmetrically disposed about the active region 13. In one such embodiment, the two optical guiding regions 12, 14 have the same thickness. In another such embodiment, the two optical guiding regions 12, 14 have the some composition. In one such embodiment, the two optical guiding regions 12, 14 have both the same thickness and the same composition. In such embodiments, the laser device has a symmetrical structure. As a result of the symmetrical structure, the laser device has a symmetrical far-field profile, such an a circular or elliptical far-field profile. It is noted that a profile may be regarded as circular if it is substantially circular, i.e., slightly elliptical or slightly non-circular. An described above, by appropriate selection, a highly elliptical profile may be obtained. Thus, the shape of the profile may be adjusted as needed by selection of thicknesses and compositions.

Figure 13B:
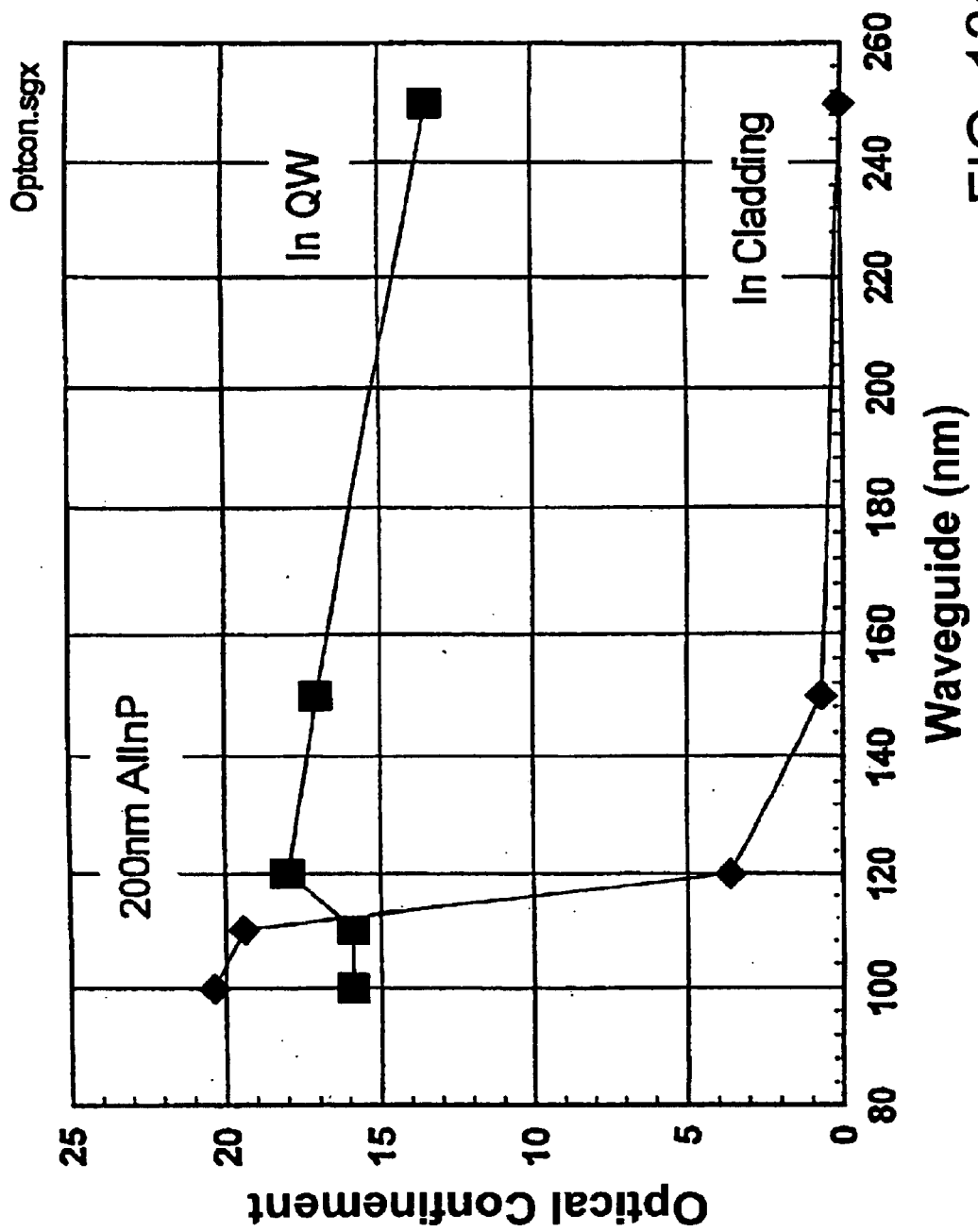
FIG. 13(b) shows the optical confinement of the structure of FIG. 12 as a function of the thickness of the waveguide.

FIG. 13(b) shows the optical confinement for the laser device of FIG. 12 as a function of the thickness of the waveguide. If the thickness of the waveguiding regions is set to be approximately 118 nm, so as to obtain a clrcular far-field profile, the optical wave is confined approximately 95% in the waveguiding regions and the active region. Only about 5% of the optical field penetrates into the cladding regions. That is, penetration of the optical field Into the cladding regions is reduced by a factor of approximately 8 compared with conventional SCH laser devices. About 18% of the optical field is confined in the active region itself, compared with approximately 16.5% for the conventional laser device of FIG. 11(a).

It is not necessary to use a 200 nm thick AlInP optical confinement layer and an 118 nm thick waveguiding region in the laser of FIG. 12 In order to obtain a circular far-field profile. A circular far-field can also be obtained by using a thinner AlInP optical confinement layer with a correspondingly thicker waveguiding region. In this case, however, the confinement of the optical field in the active region will be reduced.

Figure 14A:
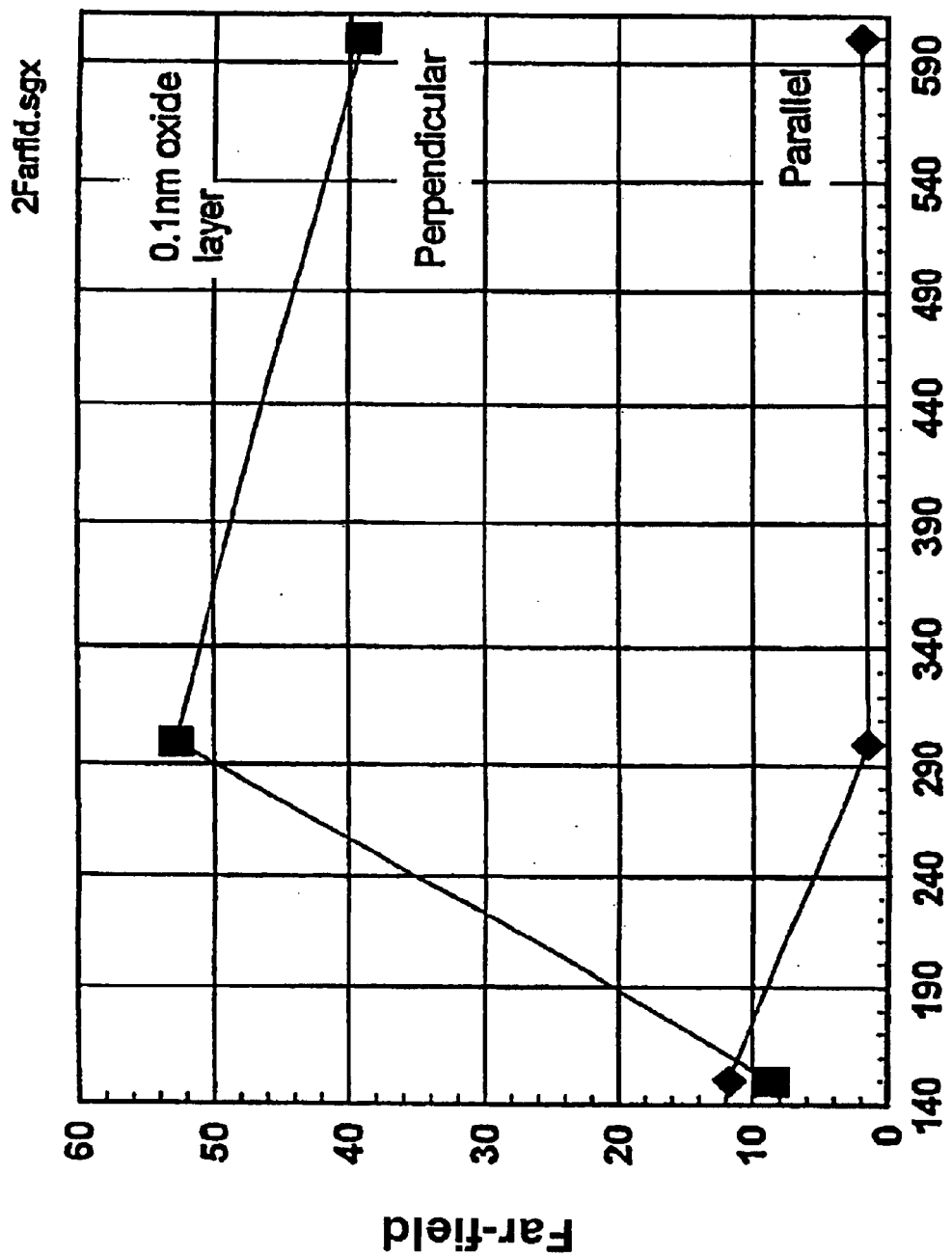
FIG. 14(a) shows the perpendicular and parallel components of the far-field emission of a laser according to another embodiment of the invention.

FIGS. 14(a) and 14(b) show the perpendicular and parallel far-field components, and the confinement of the optical field, respectively for a laser device according to a further embodiment of the present invention. This laser device is generally similar to the laser device of FIG. 12, except that the optical confinement regions each consist of a 100 nm thick AlInP layer that has been oxidised to reduce its refractive index to approximately n=1.5.

FIG. 14(a) shows the perpendicular and parallel far-field components of this laser device as a function of the thickness of the waveguiding region. FIG. 14(b) shows the confinement of the optical field of the laser device, again as a function of the thickness of the waveguiding regions.

It will be seen that selecting a thickness of around 160 nm for each waveguiding region gives perpendicular and parallel far-field components each of about 10 to 11°, so that a circular far-field image is produced. With wavegulding regions of this thickness, the optical field is almost entirely confined within the waveguiding regions and the active region, and less than 1% of the optical field penetrates into the cladding regions. Approximately 22% of the optical field is confined in the active region itself, compared with approximately 16.5% for the conventional laser device of FIG. 11(a).

Figure 1:
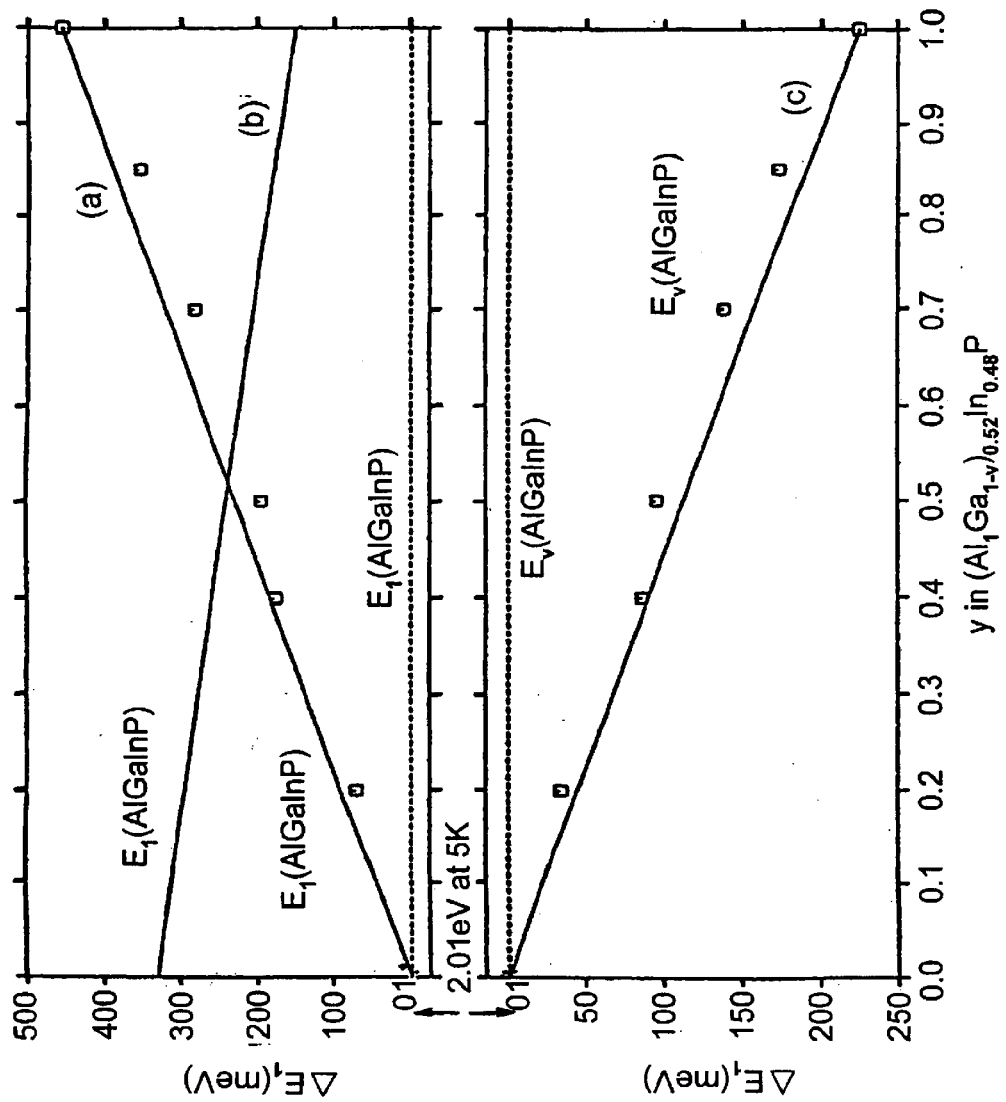
FIG. 1 shows the variation in the (Ga,In)P/(AL,Ga,In)P heterobarrier height as a function of the aluminum mole fraction of the quaternary alloy.

Although the present invention has been described with particular reference to the (Al,Ga,In)P system the present invention is not limited to this particular alloy system. A person skilled in the art of semiconductor physics and electronic materials will readily appreciate that the present invention to applicable to any heterostructure laser device whose constituents have a conduction band dependence similar to that shown in FIG. 1.

In the embodiments described above, the optical confinement layers 16. 17 have been placed at the interface between the optical guiding region 12, 14 and the cladding regions 11, 15. It is not, however, essential for the optical confinement layers to be disposed exactly at the interface between the optical guiding region and the cladding regions. For example, the optical confinement layers could, in principle, be disposed within the optical guiding region. Alternatively, the optical confinement layers could, in principle, be placed within the cladding regions, near the interfaces with the optical guiding regions. This is, however, less preferable, since it will lead to increased penetration of the optical field into the cladding regions.

In the embodiments described above, two optical confinement layers are provided, one at the p-side of the device and one at the n-side of the device. In principle, it would be possible to provide a laser with only one optical confinement layer, and this would produce an improvement in optical confinement, compared with conventional laser devices.

The laser devices of the present invention have two principal features—the provision of the optical confinement layers and the composition of the cladding regions. Each of these features could, in principle, be separately applied to a laser device. For example, providing the conventional laser devices of FIGS. 2 or 3 with an optical confinement layer of the invention would reduce the penetration of the optical field in to the cladding region and thus reduce optical absorption in the cladding region (but would not address the problems of the high resistivity of the cladding region and carrier trapping in the cladding region).

As a further example, the direct bandgap cladding region of FIG. 4 or the graded cladding region of FIG. 6, in which the energy of the DX level in the cladding layer increases away from the optical guiding region, could in principle be applied to a laser device that did not have optical confinement layers. This would reduce the carrier trapping In the cladding layer and would also reduce the heat generated in the cladding layer& but would not address the problem of the optical field penetrating into the cladding region.

In the embodiments described above with reference to FIGS. 4. 5, 6 and 12, AlInP is used as the material for the optical confinement layer(s). The present invention is not, however, limited to the use of this particular material for the optical conflnement layers. Any material having suitable properties such as, for example, a suitable value of the refractive index, can be used for the optical confinement layers.

When the invention is applied to a laser device fabricated in the (Al,Ga,In)P system, it would be possible to make the optical confinement layer(a) from, for example, AlGaInP. The aluminum mole fraction must be larger than the aluminum mole fraction of the cladding regions, so that the refractive index of the optical confinement region is lower than the refractive index of the cladding region. If the optical confinement layer made of AlGaInP, the aluminum mole fraction is preferably set to be high.

The preferred embodiments described above with reference to the (Al,Ga,In)P system use layers having an In mole fraction of 0.48, to provide lattice matching to a GaAs substrate. The invention is not however limited to this In mole fraction.

The inner device of the present invention, in one embodiment, emits light in the visible range. The laser device of the present invention, in another embodiment, emits light in the wavelength range from about 630 nm to about 680 nm. The laser device of the present invention, in another embodiment, emits light in the wavelength range from about 635 nm to about 650 nm.

What is claimed is:

1. A laser device comprising: an n-doped cladding region and a p-doped cladding region; an optical guiding region disposed between the n-doped cladding region and the p-doped cladding region; and an active region disposed within the optical guiding region;
   wherein the laser device further comprises at least one optical confinement region disposed between the active region and at least one of the cladding regions, the at least one optical confinement region having a lower refractive index than the at least one of the cladding regions,
   the composition of the n-type cladding region is selected such that the energy of the DX level in the n-type cladding region is greater than the Fermi level in the n-type cladding reaction, and
   the laser device emits light in the visible region.

2. A laser device as claimed in claim 1, wherein the at least one optical confinement region is disposed at the interface between the optical guiding region and one of the cladding regions.

3. A laser device as claimed in claim 2, wherein the Γ-conduction band of the part of the one cladding region immediately adjacent the at least one optical confinement region is substantially degenerate with the X-conduction band of the at least one optical confinement region.

4. A laser device as claimed in claim 1, wherein at least one of the cladding regions has a graded bandgap.

5. A laser device as claimed in claim 1, wherein the composition of the one cladding region is selected such that the energy of the DX level in the one cladding region is greater than the Fermi level in the one cladding region.

6. A laser device as claimed in claim 2, wherein the DX level in the part of the at least one cladding region adjacent the at least one optical confinement region is substantially degenerate with the X-conduction band in the optical confinement region.

7. A laser device as claimed in claim 1, wherein the energy of the DX level in the one cladding region increases away from the at least one optical confinement region.

8. A laser device as claimed in claim 1, further comprising a second optical confinement region disposed between the active region and the other of the cladding regions.

9. A laser device as claimed in claim 8, wherein the second optical confinement region is disposed at the interface between the optical guiding region and the other of the cladding regions.

10. A laser device as claimed in claim 1, fabricated in the (Al, Ga, In)P system, with the one cladding region being formed of AlGaInP having an aluminum mode fraction y.

11. A laser device as claimed in claim 10, where y decreases away from the at least on optical confinement region.

12. A laser device as claimed in claim 10, wherein the at least one optical confinement region is an AlGaInP layer having a greater aluminum mole fraction than the respective cladding region.

13. A laser device as claimed in claim 10, wherein the at least one optical confinement region is an AlInP layer.

14. A laser device as claimed in claim 13, wherein the at least one optical confinement region consists of oxidised AlInP.

15. A laser device as claimed in claim 10, wherein y is approximately 0.4 at the interface between the one cladding region and the at least one optical confinement region.

16. A laser device as claimed in claim 10, wherein y is approximately 0.9 at the interface between the one cladding region and the optical confinement region.

17. A laser device as claimed in claim 1, wherein the thicknesses of the optical guiding region and the or each optical confinement region are selected such that the laser device emits, in use, light having a substantially circular far-field profile.

18. A semiconductor laser device comprising an n-doped cladding region and a p-doped cladding region; an optical guiding region disposed between the n-doped cladding region and the p-doped cladding region, and an active region disposed within the optical guiding region;
   wherein the composition of the n-type cladding region is selected such that the energy of the DX level in the n-type cladding region is greater than the Fermi level in the n-type cladding region.

19. A laser device as claimed in claim 18 wherein the n-type cladding region has a direct bandgap.

20. A laser device as claimed in claim 18 wherein the laser device is fabricated in the (Al, Ga, In)P alloy system and the n-type cladding region is formed of AlGaInP having an aluminum mole fraction y where y<0.55.

21. A semiconductor laser device comprising: an n-doped cladding region and a p-doped cladding region; an optical guiding region disposed between the n-doped cladding region and the p-doped cladding region; and an active region disposed within the optical guiding region; wherein the energy of the DX level in one of the cladding regions increases away from the optical guiding region.

22. A laser device as claimed in claim 21 and fabricated in the (Al, Ga, In)P alloy system, wherein the one cladding region is formed of AlGaInP having an aluminum mole fraction y, and wherein y decreases away from the optical guiding region.

23. A laser device as claimed in claim 1, wherein the light is in the range from about 630 nm to about 680 nm.

24. A laser device as claimed in claim 1, wherein the light is in the range from about 635 nm to about 650 nm.

25. A laser device as claimed in claim 1, wherein the laser device has a symmetrical structure.

26. A laser device as claimed in claim 25, wherein the laser device has a circular or elliptical far-field profile.

27. A laser device as claimed in claim 25, wherein the laser device comprises two optical guiding regions having the same thickness.

28. A laser device as claimed in claim 25, wherein the laser device comprises two optical guiding regions having the same composition.

29. A laser device as claimed in claim 1, wherein a refractive index of the at least one optical confinement region is lower than a refractive index of the optical guiding region.

30. A laser device as claimed in claim 1, wherein an aluminum mole fraction of the at least one optical confinement region is higher than aluminum mole fractions of the cladding layer and the optical guide layer.

* * * * *